United States Patent
Babakhani et al.

(10) Patent No.: US 10,663,541 B2
(45) Date of Patent: May 26, 2020

(54) ELECTRON PARAMAGNETIC RESONANCE (EPR) SYSTEMS WITH ACTIVE CANCELLATION

(71) Applicant: WILLIAM MARSH RICE UNIVERSITY, Houston, TX (US)

(72) Inventors: Aydin Babakhani, Houston, TX (US); Xuebei Yang, Houston, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 0 days.

(21) Appl. No.: 15/574,302

(22) PCT Filed: May 18, 2016

(86) PCT No.: PCT/US2016/033077
§ 371 (c)(1),
(2) Date: Nov. 15, 2017

(87) PCT Pub. No.: WO2016/187300
PCT Pub. Date: Nov. 24, 2016

(65) Prior Publication Data
US 2018/0120390 A1 May 3, 2018

Related U.S. Application Data

(60) Provisional application No. 62/163,042, filed on May 18, 2015.

(51) Int. Cl.
*G01R 33/36* (2006.01)
*G01R 33/60* (2006.01)

(52) U.S. Cl.
CPC ......... *G01R 33/3607* (2013.01); *G01R 33/36* (2013.01); *G01R 33/60* (2013.01)

(58) Field of Classification Search
None
See application file for complete search history.

(56) References Cited

U.S. PATENT DOCUMENTS 6,009,317 A 12/1999 Wynn
9,689,954 B2 6/2017 Yang et al.
9,857,447 B2 1/2018 Yang et al.
(Continued)

FOREIGN PATENT DOCUMENTS

WO WO-2015048249 A1 4/2015

OTHER PUBLICATIONS

International Search Report and Written Opinion for PCT/US16/33077, dated Aug. 23, 2016.
(Continued)

*Primary Examiner* — Jermele M Hollington
(74) *Attorney, Agent, or Firm* — Winstead PC

(57) ABSTRACT

An active cancellation system may be utilized to cancel interference, such as from transmitter leakage or self-interference in a transceiver of an electron paramagnetic resonance (EPR) spectrometer. The active cancellation system may be inserted between the transmitter and receiver. The active cancellation system may receive the output of the transmitter, and generate a cancellation signal with the same amplitude, but phase shifted relative to the self-interference signal. The cancellation system may include an attenuator/amplitude tuner, buffer, VQ generator, and phase shifter.

22 Claims, 15 Drawing Sheets

(56) References Cited

U.S. PATENT DOCUMENTS

| | | | | |
|---|---|---|---|---|
| 2002/0084845 | A1* | 7/2002 | Eisenberg | H03F 1/3235 330/52 |
| 2009/0213770 | A1 | 8/2009 | Mu | |
| 2014/0091802 | A1 | 4/2014 | Yang et al. | |
| 2014/0097842 | A1 | 4/2014 | Yang et al. | |
| 2016/0223478 | A1 | 8/2016 | Babakhani et al. | |
| 2017/0242091 | A1 | 8/2017 | Yang et al. | |
| 2019/0346386 | A1* | 11/2019 | Babakhani | E21B 49/08 |

OTHER PUBLICATIONS

Petryakov, S., Samouilov, A., Kesselring, E., Wasowicz, T., Caia, G. L., & Zweier, J. L. (2007). Single Loop—Multi Gap Resonator for Whole Body EPR Imaging of Mice at 1.2 GHz. *Journal of Magnetic Resonance* (San Diego, Calif.: 1997), 188(1), 68-73. http://doi.org/10.1016/j.jmr.2007.05.021.

H. Yokoyama, T. Yoshimura, "Combining a Magnetic Field Modulation Coil with a Surface-Coil-Type EPR Resonator," Applied Magnetic Resonance, 2008, vol. 35, No. 1, 127-135.

T. B. Biktagirov, M. R. Gafurov, M. A. Volodin, G. V. Mamin, A. A. Rodionov, V. V. Izotov, A. V. Vakhin, D. R. Isakov, and S. B. Orlinskii, "Electron Paramagnetic Resonance Study of Rotational Mobility of Vanadyl Porphyrin Complexes in Crude Oil Asphaltenes: Probing the Effect of Thermal Treatment of Heavy Oils," Energy & Fuels, 2014, 28 (10), 6683-6687. DOI: 10.1021/ef5017494.

Espinosa et al., "Electron Spin Resonance and Electronic Structure of Vanadyl-Porphyrin in Heavy Crude Oils," Inorg. Chem. 2001, 40, 4543-4549.

T. F. Yen, J. G. Erdman, and A. J. Saraceno, "Investigation of the Nature of Free Radicals in Petroleum Asphaltenes and Related Substances by Electron Spin Resonance," Analytical Chemistry 1962 34 (6), 694-700. DOI: 10.1021/ac60186a034.

Kokal, S., Al-Dokhi, M., Al-Zubail, M., & Al-Saeed, S. (Jan. 1, 2004). Asphaltene Precipitation in a Saturated Gas-Cap Reservoir. Society of Petroleum Engineers. doi:10.2118/89967-MS.

Elsharkawy, Adel & A Al-Sahhaf, Tahar & Fahim, Mohamed & W Yarranton, Harvey. (2005). "Characterization of Asphaltenes and Resins Separated from Water-in-Crude Oil Emulsions Formed in Kuwaiti Oil Fields," AIChE Annual Meeting Conference Proceedings.

Misra, S., Abdallah, D., & Nuimi, S. (Mar. 10, 2013). Successful Asphaltene Cleanout Field Trial in on-shore Abu Dhabi Oil Fields. Society of Petroleum Engineers. doi:10.2118/164175-MS.

Jack H. Freed and George K. Fraenkel, "Theory of Linewidths in Electron Spin Resonance Spectra," The Journal of Chemical Physics, 39, 326 (1963). doi: 10.1063/1.1734250.

Cédric Lesaint, Sébastien Simon, Caterina Lesaint, Wilhelm R. Glomm, Gunnar Berg, Lars E. Lundgaard, and Johan Sjöblom, "Dielectric Properties of Asphaltene Solutions: Solvency Effect on Conductivity" Energy & Fuels 2013, 27 (1), 75-81. DOI: 10.1021/ef3013129.

Eric Y. Sheu and Oliver Mullins, "Frequency-Dependent Conductivity of Utah Crude Oil Asphaltene and Deposit," Energy & Fuels 2004, 18, 1531-1534.

Sheu E., Long Y., Hamza H. (2007) Asphaltene Self-Association and Precipitation in Solvents-AC Conductivity Measurements. In: Mullins O.C., Sheu E.Y., Hammami A., Marshall A.G. (eds) Asphaltenes, Heavy Oils, and Petroleomics. Springer, New York, NY [Partial Reference].

Lamia Goual, "Impedance Spectroscopy of Petroleum Fluids at Low Frequency," Energy & Fuels 2009, 23, 2090-2094.

Barney L. Bales and Raoul Zana, "Characterization of Micelles of Quaternary Ammonium Surfactants as Reaction Media I: Dodeclytrimethylammonium Bromide and Chloride," J. Phys. Chem. B 2002, 106, 1926-1939.

Rinard G.A., Eaton G.R. (2005) Loop-Gap Resonators. In: Eaton S.R., Eaton G.R., Berliner L.J. (eds) Biomedical EPR, Part B: Methodology, Instrumentation, and Dynamics. Biological Magnetic Resonance, vol. 24/B. Springer, Boston, MA. DOI https://doi.org/10.1007/0-306-48533-8_2.

*Quantitative EPR* (2010) Eaton, G.R., Eaton, S.S., Barr, D.P., Weber, R.T., Springer, New York.

Nikhil B. Joshi, Oliver C. Mullins, Abul Jamaluddin, Jefferson Creek, and Jim McFadden, "Asphaltene Precipitation from Live Crude Oil," Energy & Fuels 2001, 15, 979-986.

Oliver C. Mullins et al, "Advances in Asphaltene Science and the Yen-Mullins Model," Energy & Fuels 2012 26 (7), 3986-4003. DOI: 10.1021/ef300185p.

D. Orange et al., "Raman spectroscopy of crude oils and hydrocarbon fluid inclusions: A feasibility study," Mineral Spectroscopy: A Tribute to Roger G. Burns, The Geochemical Society. Special Publication No. 5, 1996, p. 65-82.

Turini Piccinato, Marilene & Guedes, Carmen & Di Mauro, Eduardo. (2012). Crude Oil by EPR, in: *Crude Oil Emulsions: Composition Stability and Characterization*, Abdel-Raouf, M. (ed.), Rijeka, Croatia: Intech, 147-168.

Abhishek Punase and Berna Hascakir, "Stability Determination of Asphaltenes through Dielectric Constant Measurements of Polar Oil Fractions," Energy Fuels 2017, 31, 65-72.

Farhad Salimi, Javad Salimi, Mozafar Abdollahifar, "Investigation of asphaltene deposition under dynamic flow conditions," Pet. Sci. (2016) 13:340-346.

M.M. Shadman et al., "How much do you know about the methods for determining onset of asphaltene precipitation?" Petroleum 3 (2017) 287-291.

J.G. Speight, "Petroleum Asphaltenes Part I Asphaltenes, Resins and the Structure of Petroleum," *Oil & Gas Science and Technology—Rev. IFP*, vol. 59 (2004), No. 5.

Vrålstad, et al., "Dielectric Properties of Crude Oil Components," Energy Fuels 2009, 23, 5596-5602. DOI:10.1021/ef900445n.

S. Velan, R. Spencer, J. Zweier, and P. Kuppusamy, "Electron paramagnetic resonance oxygen mapping (EPROM): direct visualization of oxygen concentration in tissue," Magnetic Resonance in Medicine, vol. 43, pp. 804-809, 2000.

J. Jiang, T. Nakashima, K. J. Liu, F. Goda, T. Shima, and H. M. Swartz, "Measurement of PO2 in liver using EPR oximetry," Journal of Applied Physiology, vol. 80, pp. 552-558, 1996.

J. Matsumoto, S. Matsumoto, A. Sowers, J. Koscielniak, N. Trigg, P. Kuppusamy, J. Mitchell, S. Subramanian, M. Krishna, and K. Matsumoto, "Absolute oxygen tension (pO2) in murine fatty and muscle tissue as determined by EPR," Magnetic Resonance in Medicine, vol. 54, pp. 1530-1535, 2005.

L. Montanari, M. Clericuzio, G. Del Piero, and R. Scotti, "Asphaltene radicals and their interaction with molecular oxygen: an EPR probe of their molecular characteristics and tendency to aggregate," Applied Magnetic Resonance, vol. 14, pp. 81-100, 1998.

M. A.Volodin, G. V.Mamin, V. V.Izotov, and S. B.Orlinskii, "High-frequency EPR study of crude oils," Journal of Physics: Conference Series, vol. 478, pp. 1-4, 2013.

Y. Lee and J. Corbett, "EPR studies of defects in electron-irradiated silicon: A triplet state of vacancy-oxygen complexes," Physical Review B, vol. 13, pp. 2653-2666, 1976.

J. Isoya, T. Umeda, N. Mizuochi, N. Son, E. Janzén, and T. Ohshima, "EPR identification of intrinsic defects in SiC," physica status solidi (b), vol. 245, pp. 1298-1314, 2008.

J. Anders, A. Angerhofer, and G. Boero, "K-band single-chip electron spin resonance detector," Journal of Magnetic Resonance, No. 217, pp. 19-26, 2012.

T. Yalcin and G. Boero, "Single-chip detector for electron spin resonance spectroscopy," Review of Scientific Instruments, No. 79, p. 094105, 2008.

X. Yang and A. Babakhani, "A single-chip electron paramagnetic resonance transceiver in 0.13um SiGe BiCMOS," IEEE Transactions on Microwave Theory and Techniques, vol. 63, No. 11, pp. 3727-3735, 2015.

X. Yang, P. Seifi, and A. Babakhani, "A Single-Chip Dual-Mode CW/Pulse Electron Paramagnetic Resonance Spectrometer in 0.13?m SiGe BiCMOS," in IEEE Int. Microwave Symposium, 2013.

(56) References Cited

OTHER PUBLICATIONS

D. Yang and A. Molnar, "A widely tunable active duplexing transceiver with same-channel concurrent RX/TX and 30dB RX/TX isolation," IEEE Radio Frequency Integrated Circuits Symp., pp. 321-324, 2014.

J. Zhou, T. Chuang, T. Dinc, and Harish Krishnaswamy, "Reconfigurable receiver with >20MHz bandwidth self-interference cancellation suitable for FDD, co-existence and full-duplex applications," IEEE ISSCC Dig. Tech. Papers, pp. 342-343, 2015.

D. Broek, E. A. M. Klumperink, and B. Nauta, "A self-interference-cancelling receiver for in-band full-duplex wireless with low distortion under cancellation of strong TX leakage," IEEE ISSCC Dig. Tech. Papers, pp. 344-345, 2015.

D. Broek, E. A. M. Klumperink, and B. Nauta, "A self-interference cancelling front-end for in-band full-duplex wireless and its phase noise performance," IEEE Radio Frequency Integrated Circuits Symp., pp. 75-78, 2015.

A. Mirzaei, H. Darabi, J. C. Leete, and Y. Chang, "Analysis and optimization of direct-conversion receivers with 25% duty-cycle current-driven passive mixers," IEEE Transactions on Circuits and Systems-I, vol. 57, No. 9, pp. 2353-2366, 2010.

D. Murphy, H. Darabi, A. Abidi, A. A. Hafez, A. Mirzaei, M. Mikhemar, and M. F. Chang, "A blocker-tolerant, noise-cancelling receiver suitable for wideband wireless applications," IEEE Journal of Solid-State Circuits, vol. 47, pp. 2943-2962, 2012.

J. Zhou et al, "A Blocker-Resilient Wideband Receiver with Low-Noise Active Two-Point Cancellation of >0dBm TX Leakage and TX Noise in RX Band for FDD/Co-Existence," Proc. ISSCC, pp. 352-353, 2014.

Z. Ru et al, "A software-defined radio receiver architecture robust to out-of-band interference," Proc. ISSCC, pp. 230-231, 2009.

V. Aparin et al, "An Integrated LMS Adaptive Filter of TX Leakage for CDMA Receiver Front-Ends," IEEE J. Solid-State Circuits, vol. 41, pp. 1171-1182, 2006.

J. Borremans et al, "A 40nm CMOS 0.4-6 GHz Receiver Resilient to Out-of-Band Blockers," IEEE J. Solid-State Circuits, vol. 46, pp. 1659-1671, 2011.

M. Krishna et al, "Electron Paramagnetic Resonance Imaging of Tumor pO2," Radiation Research, vol. 177, pp. 376-386, 2012.

B. Gallez et al, "In vivo EPR: when, how and why?," NMR in Biomedicine, vol. 17, pp. 223-225, 2004.

\* cited by examiner

ELECTRON PARAMAGNETIC RESONANCE (EPR) SYSTEMS WITH ACTIVE CANCELLATION

RELATED APPLICATIONS

This application claims the benefit of U.S. Provisional Patent Application No. 62/163,042 filed on May 18, 2015, which is incorporated herein by reference.

FIELD OF THE INVENTION

This invention relates to Electron Paramagnetic Resonance (EPR) systems. More particularly, to an active cancellation structure for EPR systems.

BACKGROUND OF INVENTION

Interference-resilient transceivers, where the receiver (RX) is able to operate without performance degradation under a large interference power, are often required in many applications including full-duplex wireless communication, magnetic resonance and dielectric spectroscopy, and full-duplex radar. Existing interference-resilient transceivers can be characterized into two categories: (1) Reject the interference at IF with little voltage gain at RF (mixer-first). (2) Reject the interference at RF using a high-Q filter. Unfortunately, method 1 suffers from large 1/f noise contributed by mixers and baseband circuitries at low IF due to the lack of voltage gain at RF. While method 2 has a low interference P1 dB when the frequency offset between the interference and desired RX signal is small due to the low quality factor of the RF filter. Thus, method 2 is limited by the filter quality factor.

Recently, Electron Paramagnetic Resonance (EPR) spectroscopy has attracted great interest from both academia and industry. It is in concept highly similar to nuclear magnetic resonance (NMR), except that EPR spectroscopy detects magnetic moments generated by unpaired electrons instead of nucleus. EPR spectroscopy has a broad range of applications, such as discussed in WO 2015/048249 filed Sep. 25, 2014, US2014/0091802 filed Sep. 30, 2013, and 2014/0097842 filed Sep. 30, 2013.

In EPR spectroscopy, there is a desire for low NF at low IF. TX and RX may operate at the same time, where TX operates at $f_{TX}$ of several to tens of GHz. TX leakage power may easily reach −10 dBm. RX may operate at $f_{TX} \pm f_M$, where $f_M$ is tens of kHz. The interference is caused by the power leakage from the transmitter (TX) (self-interference), which may operate at GHz frequencies, and can easily reach −10 dBm. Moreover, the frequency offset between the TX and the desired RX signal, as well as the frequency of the IF signal, may be less than 100 kHz. Under such stringent conditions, existing interference-resilient architectures cannot satisfy both noise and linearity requirements, simultaneously. As a result, conventional high-performance EPR spectrometers may separate the TX and RX into dedicated discrete components that are bulky and costly.

An active cancellation structure is discussed herein that improves sensitivity of EPR systems or the like.

SUMMARY OF INVENTION

In one embodiment, an active cancellation system may be utilized to cancel interference, such as from transmitter leakage or self-interference in a transceiver of an electron paramagnetic resonance (EPR) spectrometer. The active cancellation system may be inserted between the transmitter and receiver. The active cancellation system may receive the output of the transmitter, and generate a cancellation signal with the same amplitude, but 180° phase shifted relative to the self-interference signal. The cancellation system may include an attenuator/amplitude tuner, buffer, and phase shifter. In some embodiments, the cancellation system may further include an I/Q generator and the phase shifter may be a Cartesian phase shifter.

In yet another embodiment, an active cancellation method may include receiving an output signal from a transmitter, and attenuating/amplitude tuning the signal. The signal may then be sent to a buffer, which may further tune the amplitude of the signal in some embodiments. The signal may be converted into a phase shifted 180° relative to the self-interference signal, and subsequently combined to provide a cancellation signal that can be provided to a receiver to mitigate or eliminate self-interference. In some embodiments, the method may also include converting a differential signal into a quadrature signal, which is later combined after proper weighting of I and Q to produce the cancellation signal.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
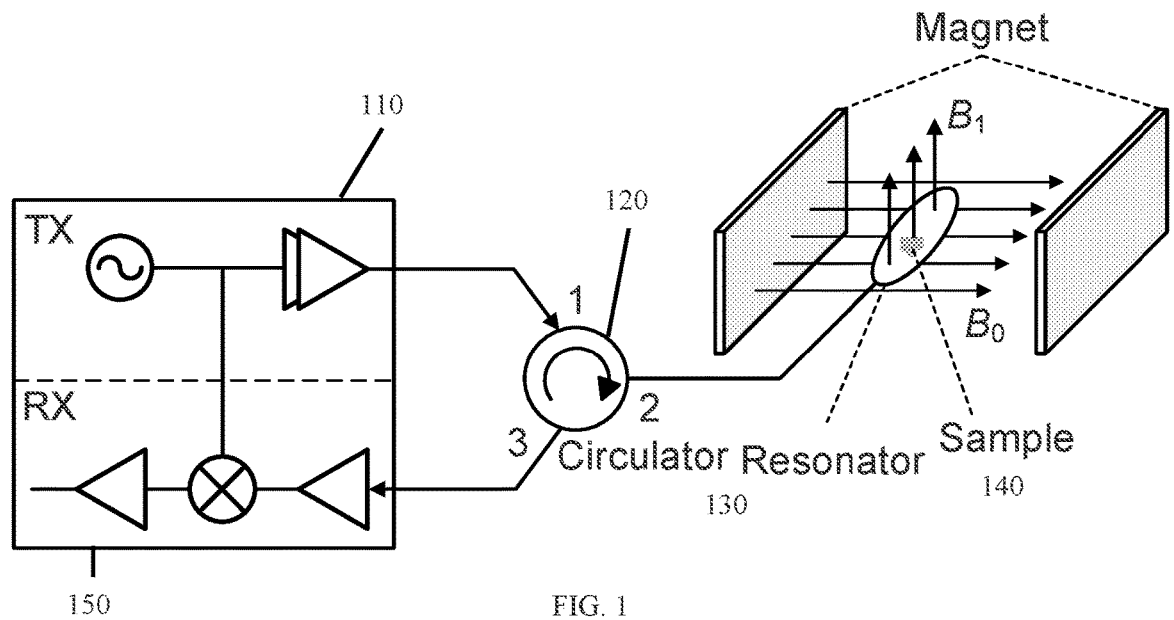
FIG. 1 shows the architecture of an absorption-power-based EPR spectrometer.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Transceivers have many applications, but in some cases, interference resulting from transmitter (TX) leakage (or self-interference) may cause signal accuracy issues for such applications. As the transmitted signal is generally known, it is possible to generate a cancelation signal in accordance with the known transmitted signal and cancel the interference at RF.

An electron paramagnetic resonance (EPR) spectrometer is the equipment that measures the EPR response of a sample. Continuous-wave absorption-power-based EPR spectrometer are the most widely-used type of EPR spectrometer and are discussed herein. FIG. 1 shows the architecture of an absorption-power-based EPR spectrometer. During the measurement, the transmitter (TX) 110 delivers a microwave signal through circulator 120 to the resonator 130, which contains the sample 140. The resonator generates a strong electromagnetic field $B_1$, which interacts with the sample and excites electron transition. The static magnetic field $B_0$ is gradually swept, but the frequency and power of the TX signal is fixed. When EPR occurs, a portion of the electromagnetic energy is absorbed by the sample, altering the reflected microwave power from the resonator 130. The receiver (RX) 150 receives the reflected power, down-converts it to baseband, and monitors the change. To reduce the effects of low-frequency noise, the static field $B_0$ is modulated. The frequency of the received signal at the baseband output of the RX 150 is the same as the modulation frequency. Theoretically, to maximize the sensitivity of the system, the modulation frequency should be much higher than the flicker noise corner of the RX 150. Unfortunately, due to limitations, such as the difficulty of generating a strong high-frequency magnetic field, the modulation frequency in current EPR spectrometers rarely exceeds 100 kHz. This poses a stringent requirement on the RX NF at low baseband frequencies.

In an absorption-power-based EPR spectrometer, the minimally-detectable number of electron spins is proportional to the square root of the RX noise factor and inversely-proportional to the TX output power. Unfortunately, low RX NF and large TX output power cannot be simultaneously satisfied using single-chip-transceiver-based EPR spectrometers. This is caused by the TX self-interference signal present at the RX input. During the operation of an EPR spectrometer, a small portion of the TX signal, denoted as TX self-interference, always couples to the RX input through two major coupling mechanisms: 1) the finite isolation value of the circulator, and 2) the reflection from the resonator due to non-perfect matching. As an example, the typical amplitude of the TX self-interference signal is lower than the TX output power (e.g. ~30 dB). Its frequency only deviates from the RX frequency by the modulation frequency of the $B_0$ field, which is no more than 100 kHz in the nonlimiting examples discussed. Because the frequency of the TX self-interference and EPR signals deviate by only a small amount, it is extremely challenging to remove the TX self-interference signal before down-conversion by a filter. As indicated before, the baseband frequency for an EPR spectrometer is the same as the modulation frequency of the magnetic field $B_0$. At such low frequencies, the flicker noise of mixers and baseband amplifiers can contribute significantly to the RX NF, if it is not suppressed by a strong voltage amplification before down-conversion. However, if the TX is generating a strong output signal, the TX self-interference would be excessively large at the RX input, saturating the RX and preventing a large voltage gain. As a result, a large TX output power and a low RX NF cannot be simultaneously achieved without using the improved architecture discussed herein. While some techniques have been proposed for mitigating the TX self-interference in an in-band full-duplex transceiver as discussed previously, they provide poor NF at low baseband frequencies.

The following discussion of a transceiver with active self-interference cancellation includes discussion of examples to demonstrate particular aspects of the present disclosure. It should be appreciated by those of ordinary skill in the art that the methods and parameters described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure. While nonlimiting examples discussed herein are directed towards EPR spectrometers, the claims are not limited to use with EPR spectrometers except where explicitly stated.

Transceiver Architecture

Figure 2:
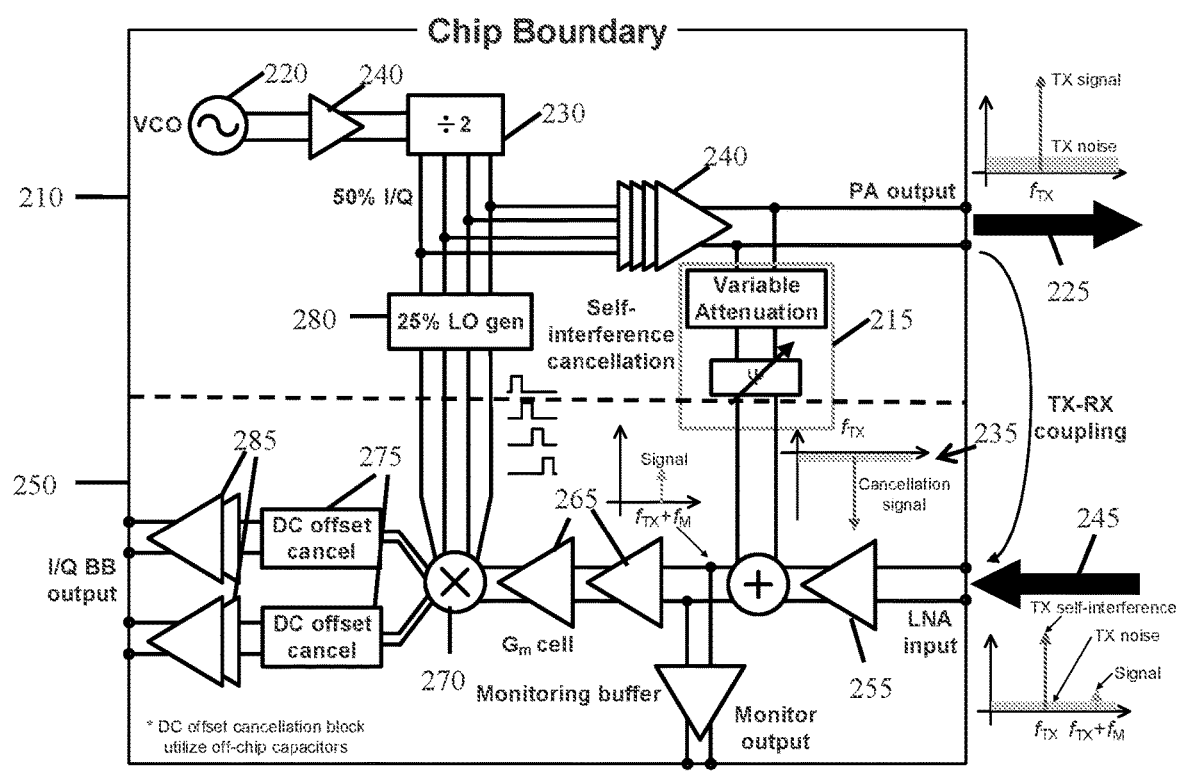
FIG. 2 shows an illustrative embodiment of a transceiver architecture providing self-interference cancellation.

A transceiver with active self-interference cancellation is discussed herein. In order to improve the sensitivity of the EPR spectrometer, integration of a cancellation circuit on the transceiver chip is proposed to mitigate the TX self-interference. In EPR spectroscopy, the sensitivity of the system increases with the operation frequency, thereby making it desirable to have a high operation frequency. FIG. 2 shows an illustrative embodiment of a transceiver architecture providing self-interference cancellation. In some embodiments, the transceiver may provide TX 210 and RX 250 on the same chip. In other embodiments, the TX 210 and RX 250 may be separated. In some embodiments, the transceiver may be utilized for EPR spectroscopy. The TX 210 may provide a voltage controlled oscillator (VCO) 220, divider 230, and amplifier(s) 240 utilized to produce a desired output. In order to cancel the TX self-interference signal or leakage, an on-chip self-interference cancellation circuit 215 is inserted between the TX 210 and the RX 250. The cancellation circuit 215 takes the TX output 225 as its input. A cancellation signal 235 should have the same amplitude as the TX self-interference signal or leakage, but should be shifted 180° phase shift to properly cancel the interference. Ideally, a cancellation signal has an identical amplitude to and shifted exactly 180° from the TX self-interference signal so that it will perfectly cancel the interference signal. However, a variance of 5% from the amplitude or 180° phase shift may be sufficient for substantial cancellation of the interference signal, and considered to be approximately equal amplitude or 180°. One the cancellation signal 235 has been phase shifted it can be provided to the input of the receiver 245 to cancel the TX self-interference signal. In order to achieve a low RX NF, the noise penalty from the self-interference cancellation circuit must be minimized. Toward this purpose, the cancellation signal is injected after the Low-Noise Amplifier (LNA) 255, instead of at the RX input. By carefully choosing the gain of the LNA 255, the noise contribution from the cancellation circuit 215 can be suppressed, while the RX still maintains good linearity.

After the TX self-interference signal is removed from the RX, the desired EPR signal is further amplified by amplifier 265 and then down-converted to baseband. At the baseband input, a DC offset filtering block 275 is used to reject the DC offset. In some embodiments, because the baseband signal in EPR spectroscopy is typically on the order of tens of kHz, external 10 µF capacitors may be utilized in the DC offset filtering block 275. After filtering, the remaining EPR signal is further amplified by baseband amplifiers 285 and delivered to an off-chip data-acquisition unit for processing. Further details of the transceiver architecture are discussed below with respect to drawings providing additional details of the architecture.

Self-Interference Cancellation Circuit

The self-interference cancellation circuit may generate a cancellation signal with tunable phase and amplitude to cancel the interference signal. No assumptions have been made on the phase of the interference signal so the cancellation circuit is required to have 360° phase tunability. As a nonlimiting example, the amplitude of the TX self-interference signal is assumed to have a maximum value of approximately −10 dBm, considering 20 dBm TX output power and a 30 dB TX-RX isolation. As introduced before, the cancellation signal is injected into RX after the EPR signal has been amplified by a LNA, whose gain is designed to be approximately 10 dB in the experimentation. Therefore, the maximum amplitude of the cancellation signal is required to exceed 0 dBm. Moreover, it is desirable that the cancellation signal has at least 15 dB of amplitude tunability so that a relatively weak self-interference signal can be cancelled as well.

Figure 3:
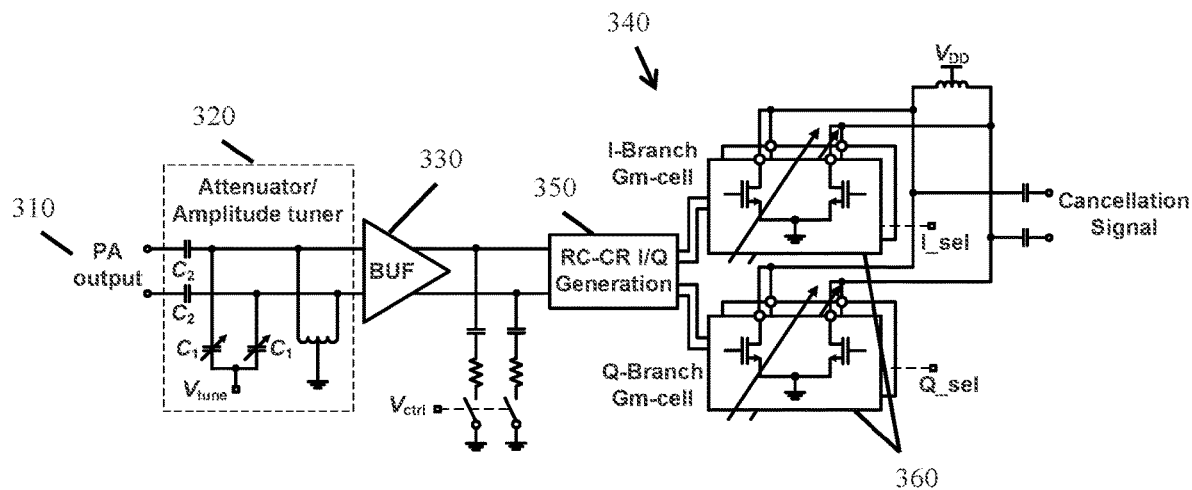
FIG. 3 presents the schematic of a self-interference cancellation circuit.
Figures 4A, 4B, 4C:
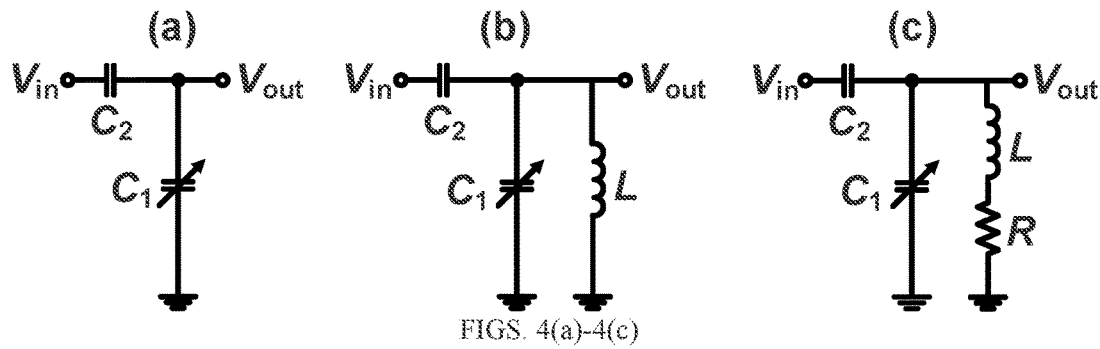
FIGS. 4(a)-4(c) respectively show a simple capacitor divider, inductor-assisted capacitor divider with an ideal inductor, and inductor-assisted capacitor divider with a real inductor.

FIG. 3 presents the schematic of the self-interference cancellation circuit, which may be part of an EPR spectrometer such as shown previously in FIG. 2. The cancellation circuit may receive an output 310 (e.g. PA output) from a transmitter, thereby essentially sampling the signal that is to be cancelled. Because the TX output may exceed a certain decibel-milliwatts level (e.g. 20 dBm), the PA output 310 (e.g. from amplifier 240) may be attenuated and amplitude tuned by an attenuator/amplitude tuner 320 before outputting the signal or cancellation signal to the remainder of the cancellation circuit; otherwise, the active devices in the cancellation circuit may face severe reliability/breakdown concerns. In some embodiments, the attenuator at the input of the cancellation circuit may be realized through a voltage divider or through an active circuit or device. In some embodiments, the active circuit or device may have a gain of smaller than 1 to increase the isolation between the output and input. As a nonlimiting example, the active circuit may be transistor based. In order to reduce the noise from the self-interference cancellation circuit, the amplitude tuner may be merged with the attenuator (or herein attenuator/amplitude tuner 320). An extra stage to perform amplitude tuning for the cancellation signal can be utilized, but the merged attenuator/amplitude tuner 320 is preferred. Two varactors (e.g. reverse-biased diode varactors) are merged with the voltage divider and used to perform the amplitude tuning to minimize the added thermal noise. A resistor divider could be utilized, but the two reverse-biased diode varactors are preferred. By changing the capacitance of the varactors, the dividing ratio is varied. In a divider containing only two capacitors $C_1$ and $C_2$, as shown in FIG. 4(a), if the varactor capacitance $C_1$ can be increased by N×, without considering the load impedance, the amplitude tuning range of the divider output is $$\frac{NC_1 + C_2}{C_1 + C_2} \qquad (1)$$

To achieve a large amplitude tuning range of the divider output, the tuning range of the varactor capacitance should be maximized. Unfortunately, in the process where the proposed transceiver is implemented, the tuning range of the varactor capacitance is limited to approximately 2-3×. Therefore, the amplitude tunability of the divider output is restricted to 10 dB or less. This number could be further reduced if the load impedance is considered. In order to enlarge the amplitude tuning range of the divider output, a parallel LC resonance network is used to increase the tuning range for the effective capacitance of the varactor. As shown in FIG. 4(b), if an inductor is connected in parallel to the varactor, the admittance of the network becomes $$Y = j\omega C_1 + \frac{1}{j\omega L} \qquad (2)$$

If the value of L and $C_1$ are chosen such that the admittance always has a positive imaginary part, the effective capacitance of this LC network would be $$C_{eff} = C_1 - \frac{1}{\omega^2 L} \quad (3)$$

Now the tuning range of $C_{eff}$ is $$\frac{NC_1 - \frac{1}{\omega^2 L}}{C_1 - \frac{1}{\omega^2 L}} \quad (4)$$

By choosing $C_1$ slightly larger than $$\frac{1}{\omega^2 L},$$

the tuning range of $C_{eff}$ could be much larger than 3, and thus the amplitude of the divider output could achieve a large tuning range. Moreover, because the admittance of the LC network is purely imaginary and remains positive, the phase shift of the voltage divider is constant across all the dividing ratios.

In reality, the quality factor of the inductor may limit the amplitude tuning range of the divider output. If the inductor has a quality factor of Q, the admittance of the parallel LC network is $$Y = j\omega C_1 + \frac{1}{j\omega L + \frac{\omega L}{Q}} = \quad (5)$$

$$j\omega C_1 - \frac{j\omega L}{\omega^2 L^2 \left(1 + \frac{1}{Q^2}\right)} + \frac{\frac{\omega L}{Q}}{\omega^2 L^2 \left(1 + \frac{1}{Q^2}\right)} \approx j\omega C_1 - \frac{j}{\omega L} + \frac{1}{\omega L Q}$$

Note that the effective capacitance remains the same, as in the case where the inductor is ideal, but the admittance now has a positive real part. The resulting tuning range of the dividing ratio is $$\frac{1 + j\omega^2 LQ(C_2 + C_{eff-max})}{1 + j\omega^2 LQ(C_2 + C_{eff-min})} \quad (6)$$

Figures 5A, 5B:
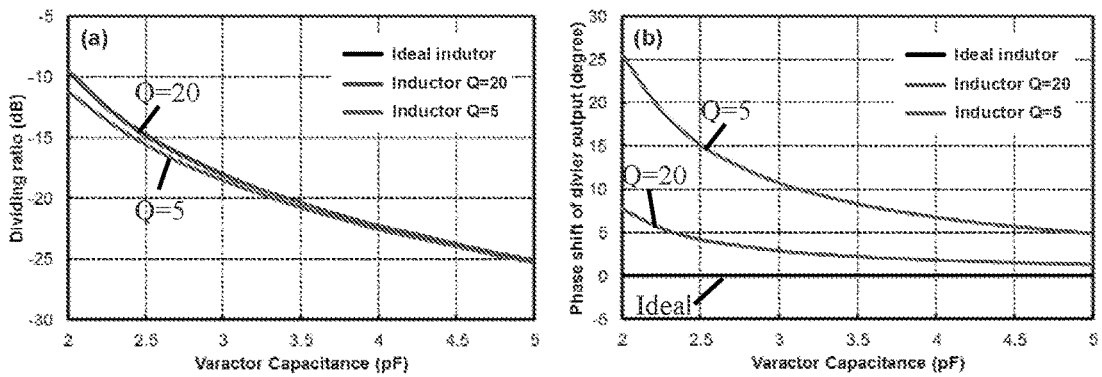
FIGS. 5(a)-5(b) respectively show simulation results for the dividing ratio under different inductor Q, and simulation results for the phase shift of the divider output under different inductor Q.

Here $C_{eff-max}$ and $C_{eff-min}$ are the maximum and minimum values of $C_{eff}$. This equation shows that, for the same values of $C_{eff}$ and $C_2$, a lower inductor Q results in a lower tuning range of the dividing ratio. Moreover, the phase shift of the divider output would vary at different dividing ratios due to the finite inductor Q. FIGS. 5(a)-5(b) respectively plot the simulation results for the dividing ratio under different inductor Q and for the phase shift of the output of the voltage divider under different inductor Q. The simulation is performed at 4.5 GHz. $C_2$ is set at 200 fF, the inductance is chosen to be 0.8 nH, and $C_1$ is varied from 2 pF to 5 pF. As shown, the inductor Q should be maximized to achieve a larger tuning range of the divider ratio plus a small variation in the phase shift of the divider output. As a nonlimiting example corresponding to experimental example, with an inductor Q of 13, the divider output has a tuning range of 14 dB, and the phase shift across the entire tuning range is within ±4° in simulation.

Returning to FIG. 3, a high input-impedance buffer 330 follows the attenuator/amplitude tuner 320 and receives the signal from the tuner. The input impedance of the buffer 330 can be absorbed into the quality factor of the inductor when analyzing the performance of the voltage divider. Because the amplitude of the divider output can still be large, high breakdown transistors are used when constructing the buffer, such as with, but not limited to, high breakdown transistors (e.g. 10V or higher). To provide additional tuning of the amplitude of the cancellation signal, the load impedance of the buffer can be varied. The signal from the buffer 330, which has been amplitude tuned and attenuated, may be provided to a phase shifter 340. The phase shifter 340 receiving the signal may phase shift the cancellation signal to 180° relative to the TX self-interference signal. The cancellation signal may be outputted by the phase shifter 340 to a receiver to cancel the interference caused by TX leakage.

In some embodiments, the signal or cancellation signal may be a differential signal. In such embodiments, an I-Q generator 350 may follow the buffer and converts the differential signal into a quadrature signal. The quadrature signal is sent to a Cartesian phase shifter 360, which phase shifts and assigns different weights to the I and Q branches of the quadrature signal to provide proper weighting for the cancellation signal to cancel the self-interference signal. I can be regarded as a vector on the real axis and Q can be regarded as a vector on the imaginary axis. By proper weighting of I and Q, it is possible to generate any value on the complex plane. Subsequently, the I and Q branches are combined to form the cancellation signal. The weights of the I and Q signals are controlled by varying the gain of the two buffers 330 that amplify the signal. The cancellation signal is finally injected into the RX through a buffer.

Figure 6:
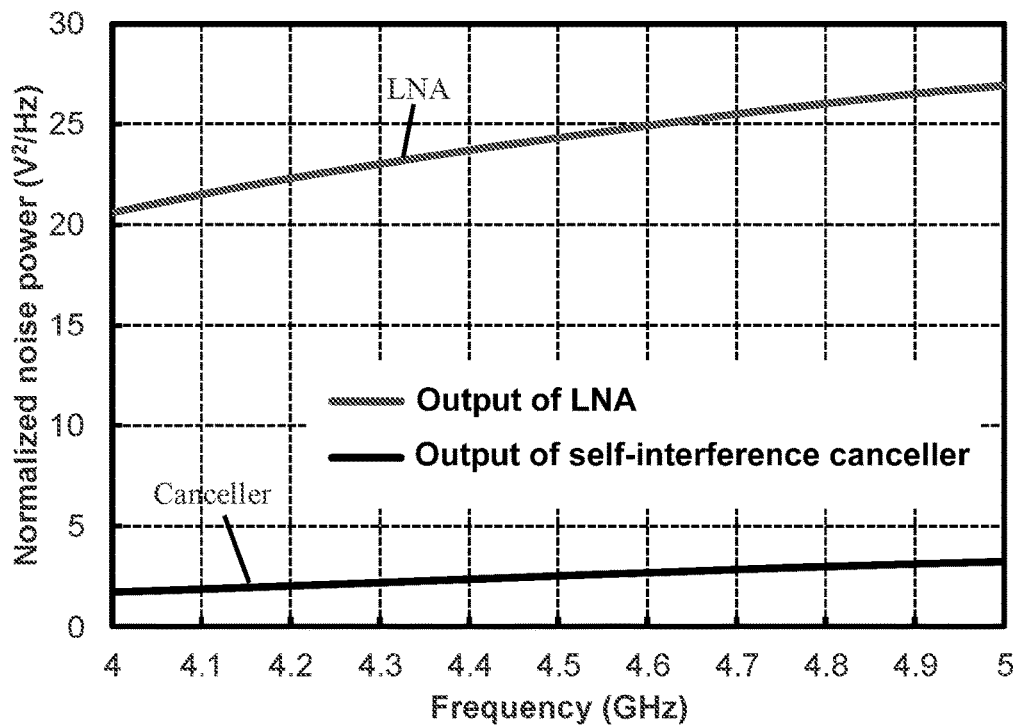
FIG. 6 shows simulated noise power at the LNA output and the cancellation circuit output when the cancellation circuit gain is set at the maximum value.

An important criteria of the self-interference cancellation circuit is that its noise contribution must be small. To achieve this goal, voltage amplification in the cancellation circuit is mostly avoided, as any voltage gain will amplify the noise of the cancellation circuit as well. FIG. 6 presents the simulation results of the noise contribution from the cancellation circuit. The simulation is performed when the gain of the cancellation circuit is set at the maximum value. At the LNA output, where the cancellation signal is injected to the RX, the noise introduced from the cancellation circuit is much smaller than the noise caused by the LNA (including the noise from the 500 LNA input and the noise produced by the LNA). This translates to a noise penalty of only 0.2 dB.

Design of the TX and RX

Figures 7A, 7B:
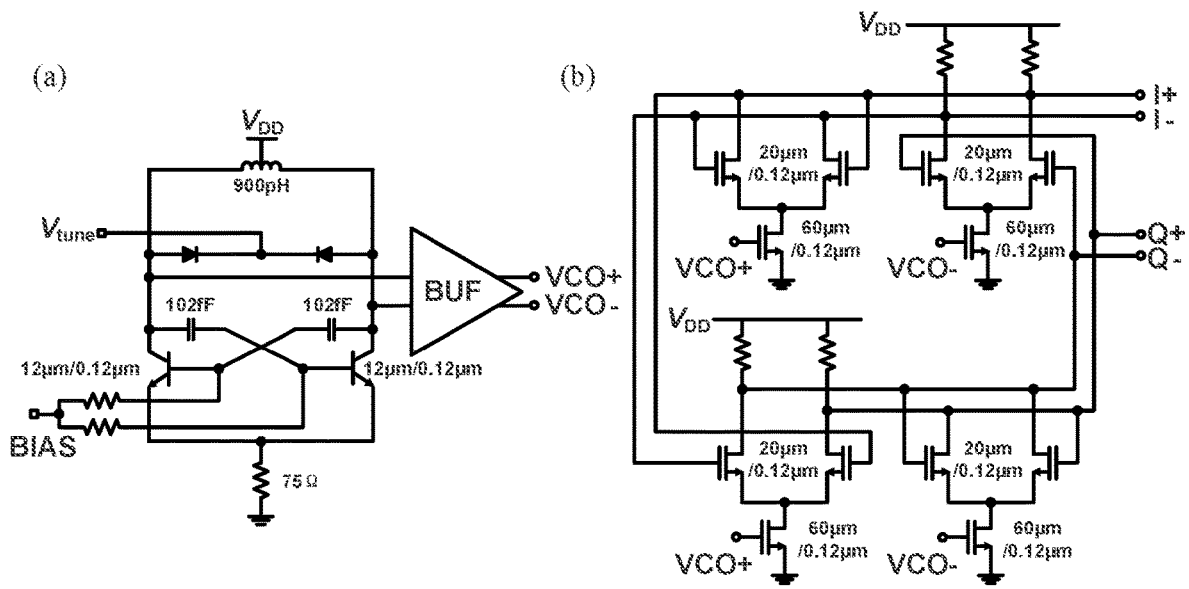
FIGS. 7(a)-7(b) respectively show schematic of a VCO and a current-mode logic (CML) frequency divider.

Additional components of the EPR spectrometer shown in FIG. 2 are discussed in further detail herein. The TX signal is generated using a Voltage-Controlled Oscillator (VCO) 220. The frequency of the VCO 220 may be designed to be twice the operation frequency of the EPR spectrometer. A frequency divider 230 then divides the frequency of the VCO signal by two, simultaneously providing I and Q signals that are necessary to generate the LO signals for the down-conversion mixer. FIGS. 7(a)-7(b) presents the schematic of the VCO and the frequency divider. The VCO takes a differential cross-coupled design. As a nonlimiting example, the VCO frequency is around 9 GHz, The frequency divider uses a Current-Mode Logic (CML) structure, which is suitable for high-speed operation.

Figure 8:
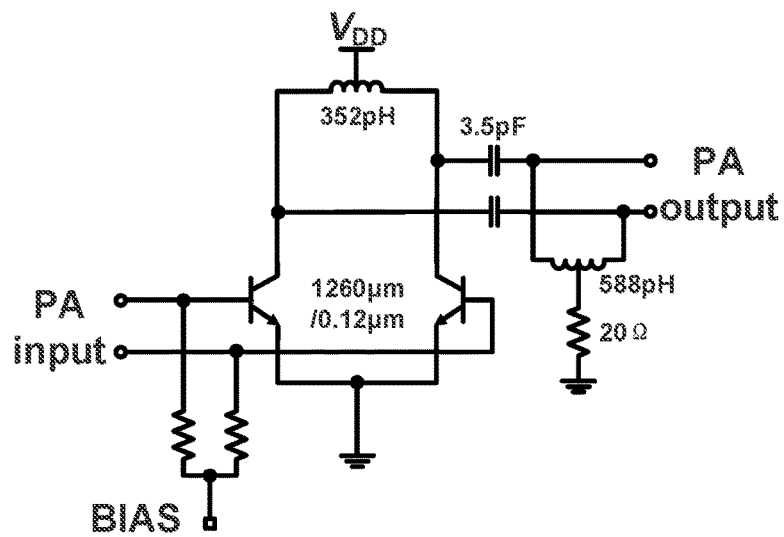
FIG. 8 shows a schematic of a power amplifier (PA)

Returning to FIG. 2, following the frequency divider 230, an amplifier chain or power amplifier (PA) 240 amplifies the TX signal. The PA 240 finally delivers the signal to a differential pair of loads (e.g. 50Ω). The schematic of the PA is shown in FIG. 8. The PA is based on a class-AB design and is fully integrated on-chip. The simulated input-referred 1 dB compression point (P1 dB) is 7 dBm.

Figure 9:
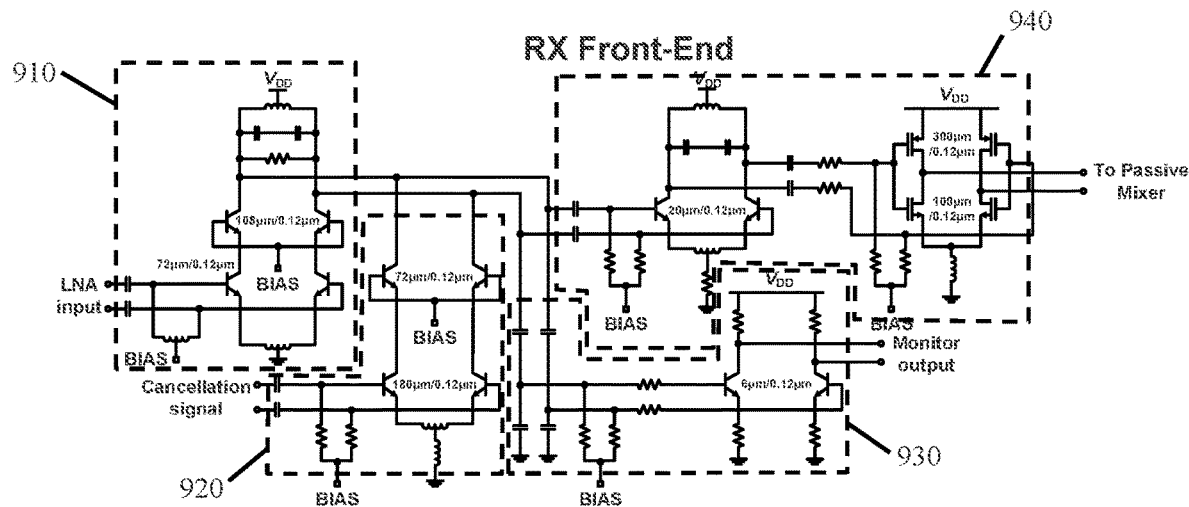
FIG. 9 shows a schematic of a receiver (RX) front end.

The detailed design of the RX front-end corresponding to the EPR spectrometer in FIG. 2 is presented in FIG. 9. The first stage in the RX is an inductive-degenerated cascode LNA 910. The load of the LNA 910 is shared with the buffer 920 of the self-interference cancellation circuit, which injects the cancellation signal at the LNA output. In order to monitor the effects of the self-interference cancellation, a voltage-monitoring buffer 930 is added at the LNA output. This buffer 930 senses the LNA output, attenuates it (e.g. 10 dB), and then sends it to output pads. The monitor output of the monitoring buffer 930 is used to guide the amplitude and the phase tuning of the cancellation signal. A $G_m$ cell buffer (CMOS part of 940) amplifies the signal further. After the TX self-interference signal has been removed from the RX, the remaining EPR signal is further amplified to suppress the flicker noise caused by mixers and baseband amplifiers. Referring to FIG. 2, the down-conversion is performed by a current-mode passive mixer 270. Compared to active mixers, the passive mixer 270 introduces a smaller flicker noise. Moreover, by minimizing the input impedance of the baseband Trans-Impedance Amplifier (TIA), a current-mode passive mixer 270 provides an improved linearity. This is because the large voltage swing, which causes device non-linearities, is avoided in the circuit. The LO signal of the passive mixer is generated from the I/Q outputs of the frequency divider following the VCO (e.g. LO generator 280). The signal may have a 25% duty cycle, increasing the mixer conversion gain by 3 dB, compared to a 50% duty cycle LO. The design of the $G_m$ cell (CMOS part of 940) is also shown in FIG. 9. It is constructed using a class AB CMOS cell. The $G_m$ cell has very high linearity. In simulation, the trans-conductance gain is only reduced by 1 dB when the input voltage swing reaches 1.4V.

Figure 10:
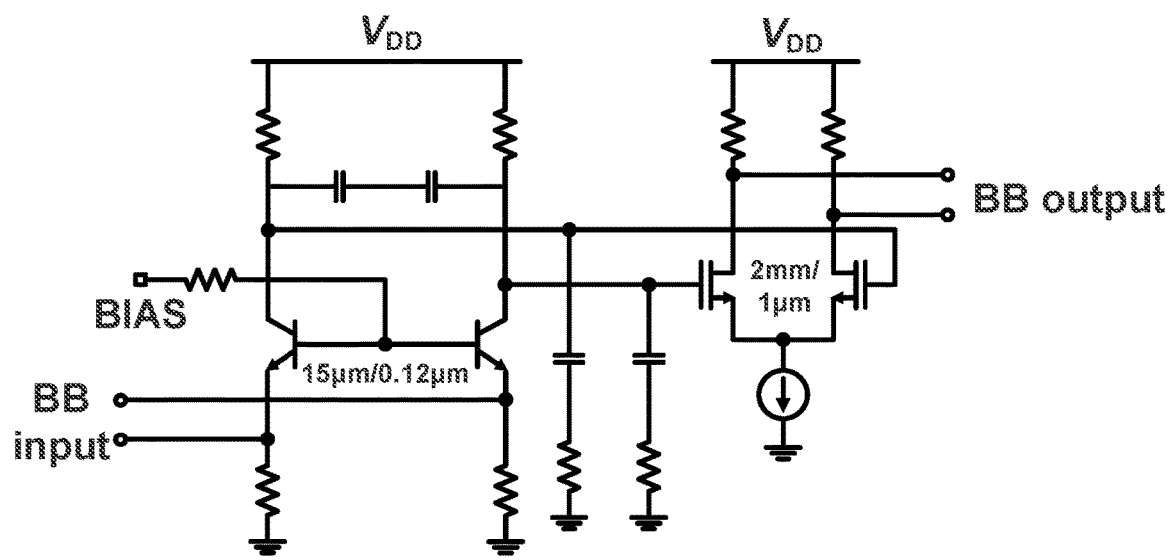
FIG. 10 shows a schematic of baseband amplifiers.

The design of the baseband amplifiers is shown in FIG. 10. The baseband TIA is implemented using a common-base amplifier. The input impedance is kept small (e.g., 10Ω) to increase the linearity of the $G_m$ cell and the passive mixer. The signal is finally amplified and delivered off chip through a buffer (e.g. 50Ω).

Transceiver Measurement Results

Figure 11:
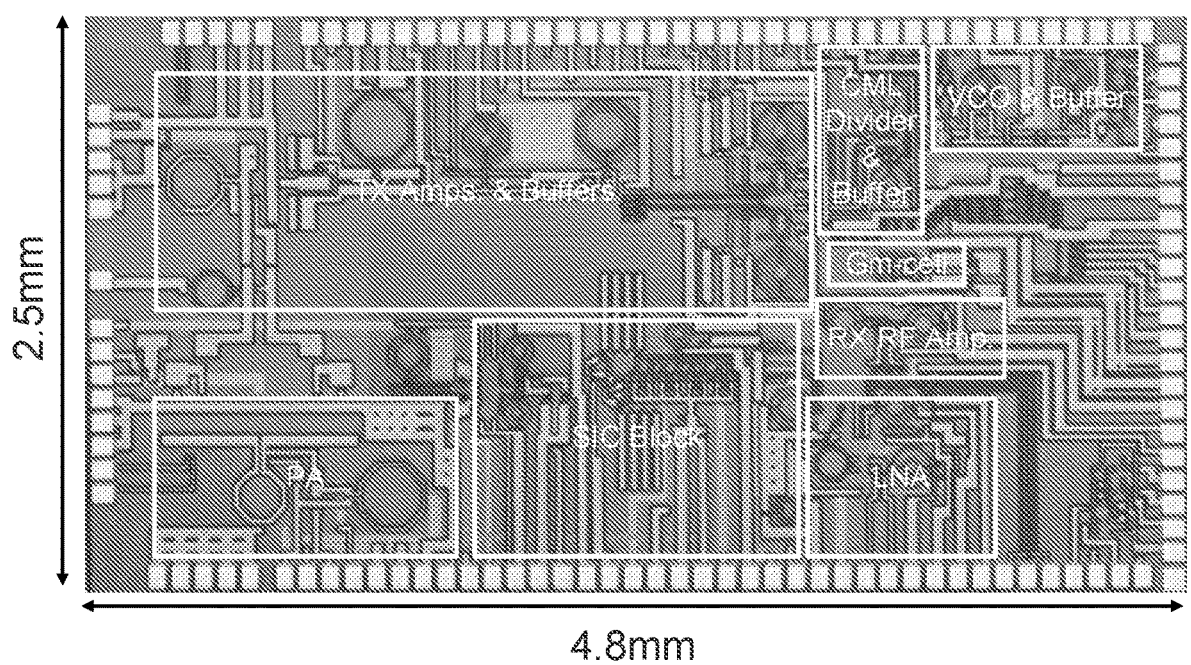
FIG. 11 shows a micrograph of a fabricated chip.

FIG. 11 presents the micrograph of the reported transceiver. The transceiver chip is fabricated in IBM 0.13 μm BiCMOS process technology. It occupies an area of 4.8 mm by 2.5 mm and consumes 2 W of DC power during the operation. Major blocks of the transceiver are labeled in the figure.

Figure 12:
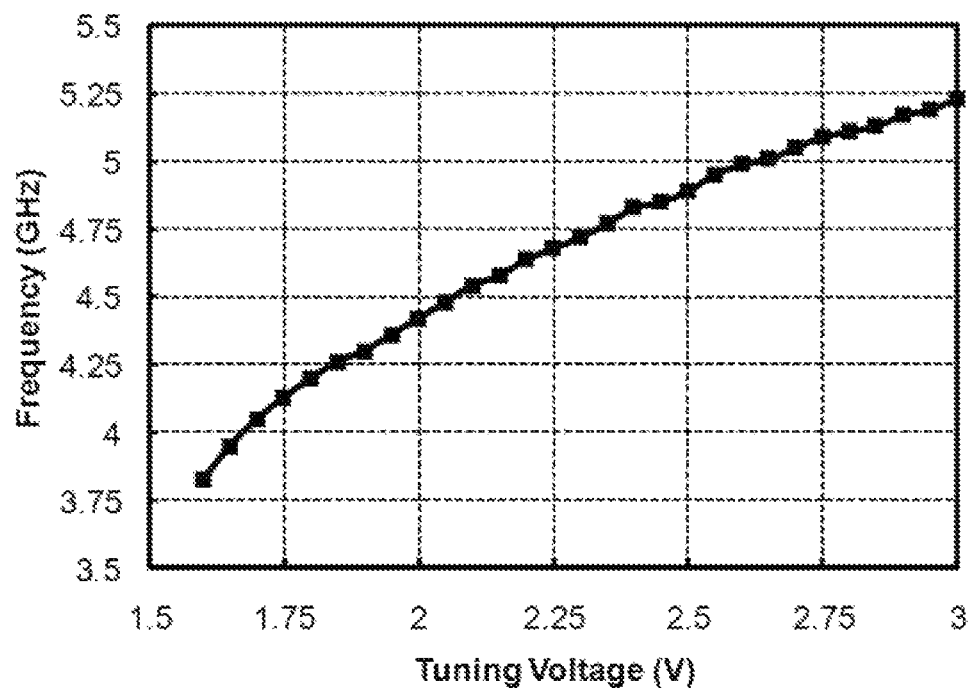
FIG. 12 shows measurement results for the VCO tuning range.

The measured frequency tunability of the TX signal is shown in FIG. 12. During this measurement, the voltage of the tuning node of the on-chip VCO is varied, and the frequency of the frequency divider output is measured using an Agilent signal analyzer N9030A. As shown in the figure, the frequency of the signal can be varied from 3.8 GHz to 5.2 GHz.

Figure 13:
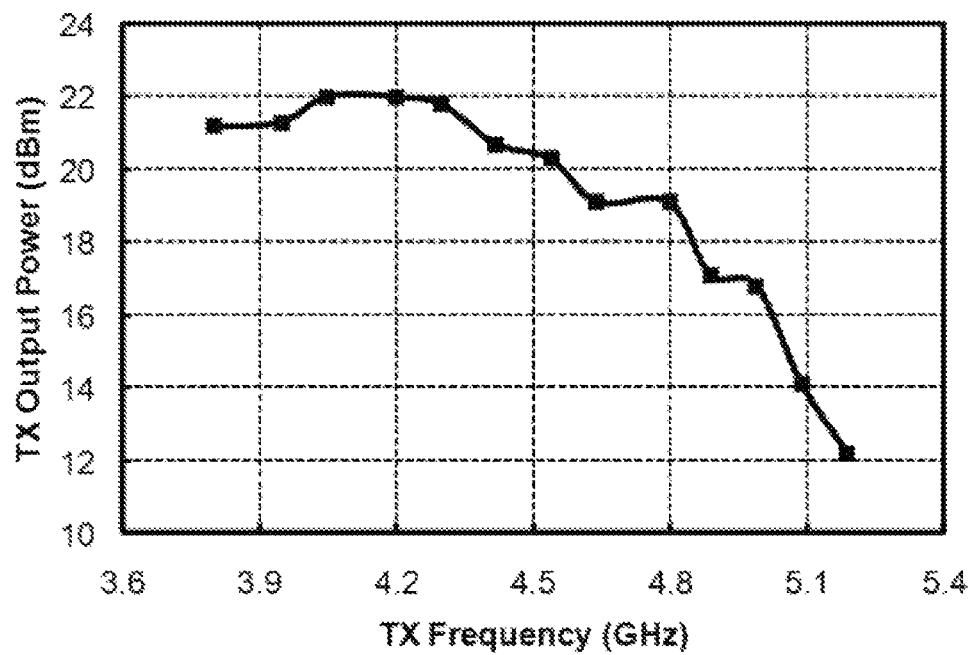
FIG. 13 shows measured TX output power versus frequency.

The TX output power versus frequency is shown in FIG. 13. This power is measured after the differential TX outputs have been combined using an off-chip balun. It is observed that the TX can generate a maximum output power of 22 dBm. The measured 3 dB bandwidth is 1 GHz (from 3.8 GHz to 4.8 GHz.).

Figures 14A, 14B:
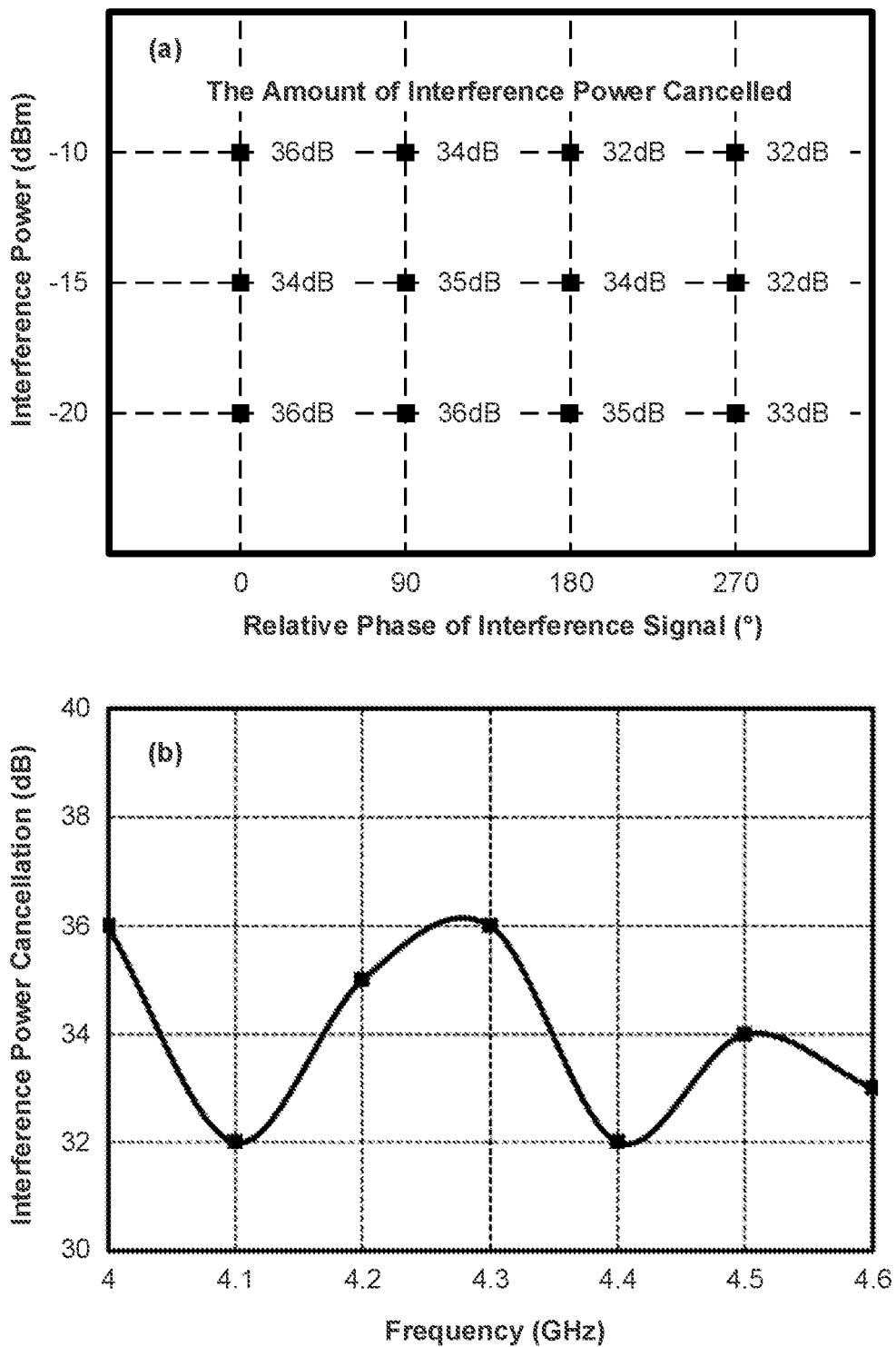
FIGS. 14(a)-14(b) respectively show measured self-interference cancellation under different interference power and phase, and measured self-interference cancellation under different frequencies.

The performance of the self-interference cancellation circuit is shown in FIGS. 14(a)-14(b). The purpose of these measurements is to determine if the cancellation circuit can cancel the TX self-interference signal across a wide range of phase, amplitude, and frequencies. During this measurement, the TX output is connected to the RX input through an external phase shifter and a variable-gain attenuator. Therefore, the phase and amplitude of the self-interference signal can be externally controlled and varied. Moreover, the frequency of the self-interference signal can be controlled by varying the oscillation frequency of the on-chip VCO. As the phase, amplitude, and frequency of the TX self-interference signal are extensively varied, the control voltage of the on-chip self-interference cancellation circuit is changed to cancel the self-interference signal. As a proof-of-concept design, an external voltage supply with a step voltage of 0.01V provides the control voltages for the cancellation circuit. FIGS. 14(a)-14(b) respectively show the measurement results for interference power (dBm) v. phase (degrees) and interference power cancellation (dB) v. frequency (GHz). Clearly, the TX self-interference signal can be cancelled by at least 32 dB across a wide range of phases, amplitudes, and frequencies.

Figure 15:
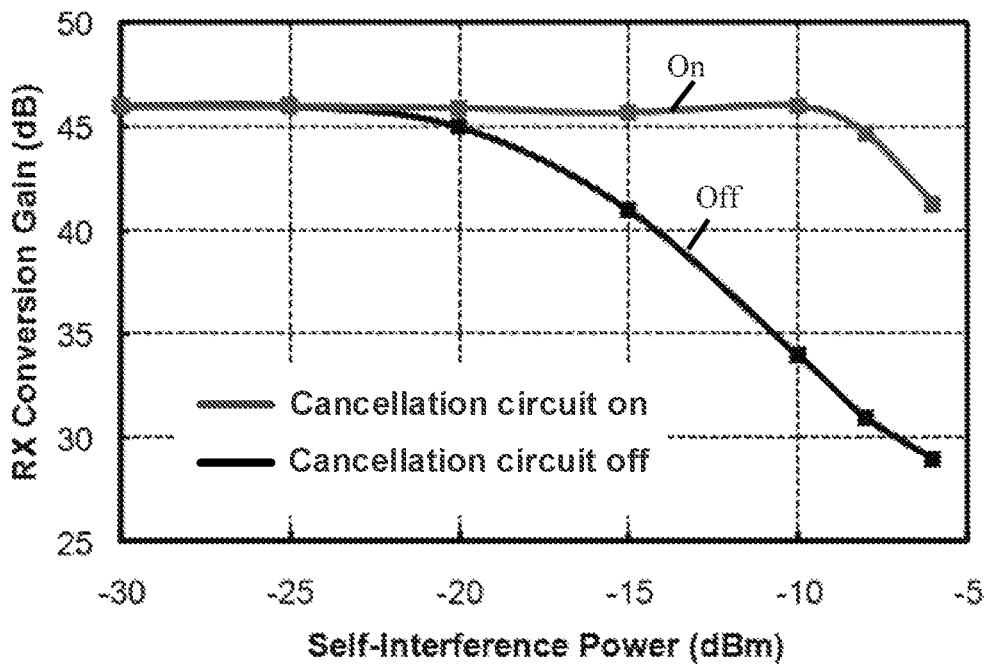
FIG. 15 shows measurement results for the RX conversion gain.

The RX conversion gain and linearity are studied next in FIG. 15. As is shown in this figure, the RX achieves a conversion gain of 46 dB. If the self-interference cancellation circuit is turned off, the self-interference P1 dB is −20 dBm. However, when the self-interference cancellation circuit is turned on and the TX self-interference signal is cancelled, the self-interference P1 dB increases to −8 dBm. This demonstrates the effectiveness of the self-interference cancellation circuit.

Figure 16:
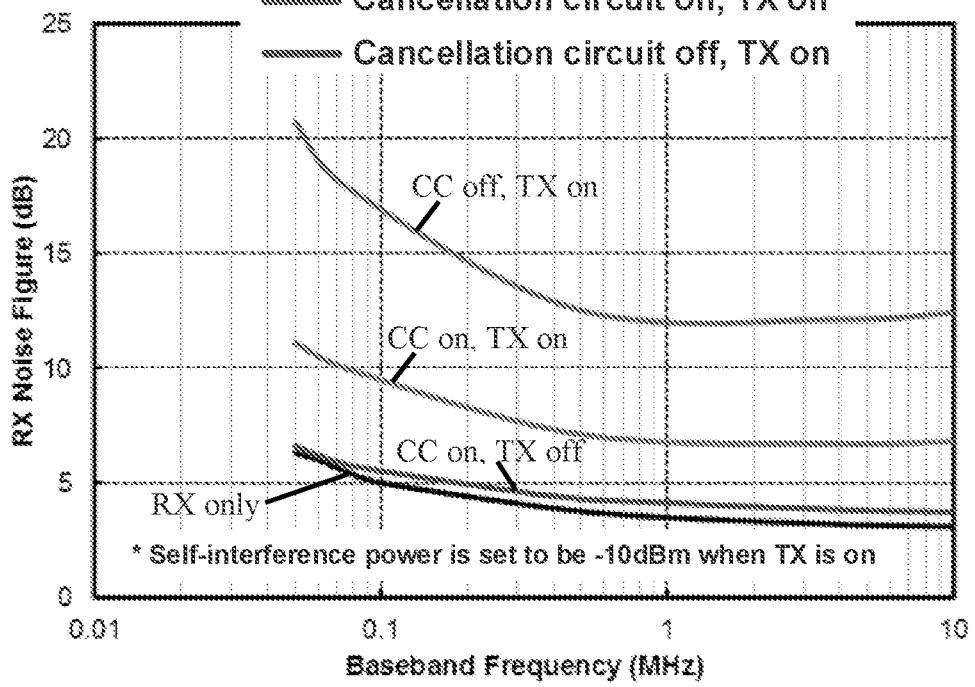
FIG. 16 shows measurement results for the RX NF under various conditions.

Finally, the NF of the RX is studied. During the NF measurement, a stable external RF source is used to generate the TX and LO signals for the down-conversion mixer. This improves measurement accuracy, especially at low baseband frequencies. As shown in FIG. 16, when both the TX and the cancellation circuit are turned off, the RX achieves a NF of 3.1 dB/6.3 dB at 10 MHz/50 kHz baseband frequencies. When the TX remains off and the cancellation circuit is turned on and configured at the maximum gain settings, the cancellation circuit incurs a noise penalty of no more than 0.6 dB across the baseband frequencies from 50 kHz to 10 MHz. When the TX and cancellation circuit are turned on and the self-interference power is −10 dBm at the RX input, the RX NF is 6.8 dB/11.1 dB at 10 MHz/50 kHz baseband. The degradation in the NF is believed to be attributed to multiple factors, such as the increased noise of the power supply and ground rail caused by the TX. If the cancellation circuit is turned off under the same self-interference power, the RX NF is 12.4 dB/20.7 dB at 10 MHz/50 kHz baseband frequencies. This demonstrates that the self-interference cancellation circuit can improve the NF significantly when there is a strong TX self-interference signal at the RX input.

Table I provides a summary of the performance of an improved transceiver. The reported transceiver achieves the lowest NF, especially at low baseband frequencies. The flicker noise corner of the reported transceiver is 60 kHz, more than one order of magnitude lower than prior works. Furthermore, the reported transceiver is the first work that demonstrates the operation of the in-band full-duplex RX and the associated self-interference cancellation circuit when a co-integrated TX is operating at the same time and frequency band and generating >20 dBm power.

TABLE I

Performance summary

| | This work |
|---|---|
| Architecture | Self-interference cancellation at RF with large voltage gain before down-conversion |
| On-chip blocks | Transceiver |
| Operating freq. | 3.8-4.8 GHz |
| TX output power | 22 dBm |
| Maximum RX gain | 46 dB |
| RX NF (TX & cancellation circuit Off) | 3.1 dB[3] |
| RX NF at 50 kHz baseband frequency (TX & cancellation circuit Off) | 6.3 dB |
| RX 1/f noise corner (TX & cancellation circuit Off) | 60 kHz |
| RX NF degradation when cancellation circuit is on (TX Off) | <0.6 dB |
| RX NF when co-integrated TX is On and self-interference cancellation circuit cancels TX self-interference | 6.8 dB/11.1 dB at 10 MHz/50 kHz baseband frequency (22 dBm/−10 dBm TX/self-interference power) |
| Self-interference P1 dB | −8 dBm |
| Technology | 0.13 μm BiCMOS |

In order to demonstrate the advantage of active cancelation in real-world applications, a spectrometer based on the proposed transceiver for Electron Paramagnetic Resonance (EPR) spectroscopy was built and tested.

In the proposed transceiver, it is demonstrated that 15 dB improvement in SNR can be achieved compared to the previous work. Furthermore, in addition to the traditional method of magnetic-field sweep, for the first time, the method of frequency-sweep in EPR spectroscopy is demonstrated.

Figure 17A:
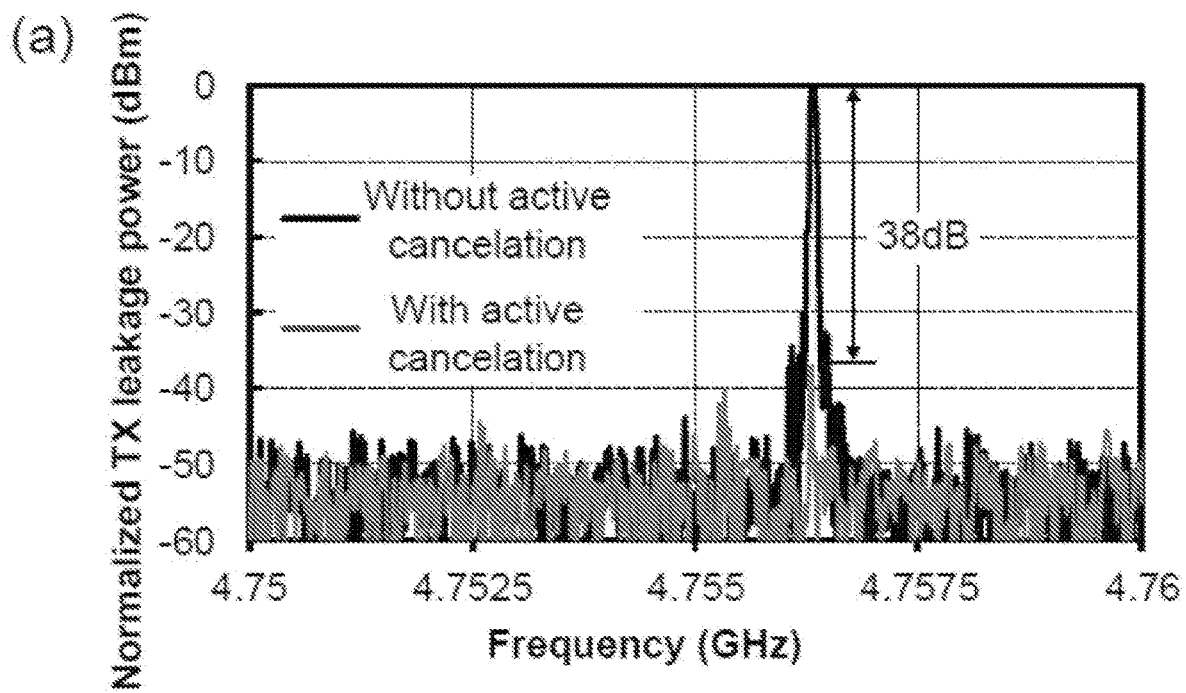
FIGS. 17(a)-17(b) respectively show the signal spectrum measured at the monitoring node under a TX leakage of −20 dBm and plot of the conversion gain of the RX at various TX leakage power levels.
Figure 17B:
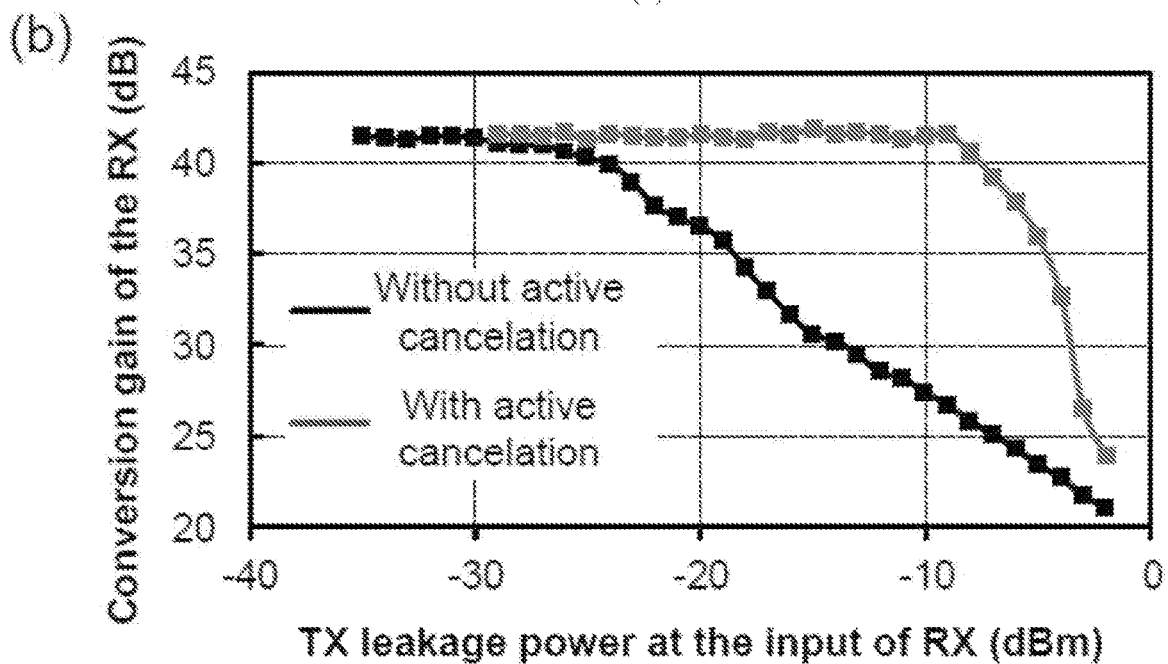

FIG. 17(a) presents the signal spectrum measured at the monitoring node under a TX leakage of −20 dBm. It is observed that 38 dB cancelation of the TX leakage can be achieved. FIG. 17(b) plots the conversion gain of the RX at various TX leakage power levels. The active cancelation improves the interference P1 dB from −25 dBm to −8 dBm, and increases the RX gain by up to 15 dB. During this measurement, the TX output is sent to the RX input through an external variable-gain attenuator to mimic the TX leakage. The leakage power is adjusted by tuning the attenuation value. The TX leakage power at the power monitoring node in the RX is measured to evaluate the effect of cancellation and guide the tuning of the VGA and phase shifter in the active cancellation block. During the tuning, both Vtune1 and Vtune2 are tuned from 0V to 1.2V with a step resolution of 10 mV. Since RX adopts an onchip VCO as the LO, due to the phase noise and frequency instability of the VCO, an accurate measurement of NF at 10 kHz IF is unavailable. The simulated NF of the RX at 10 kHz IF improves by 5.2 dB when active cancelation is enabled. To the best of the authors' knowledge, this is the first demonstration of a fully-integrated transceiver with an active TX leakage cancelation structure.

Figures 18A, 18B, 18C:
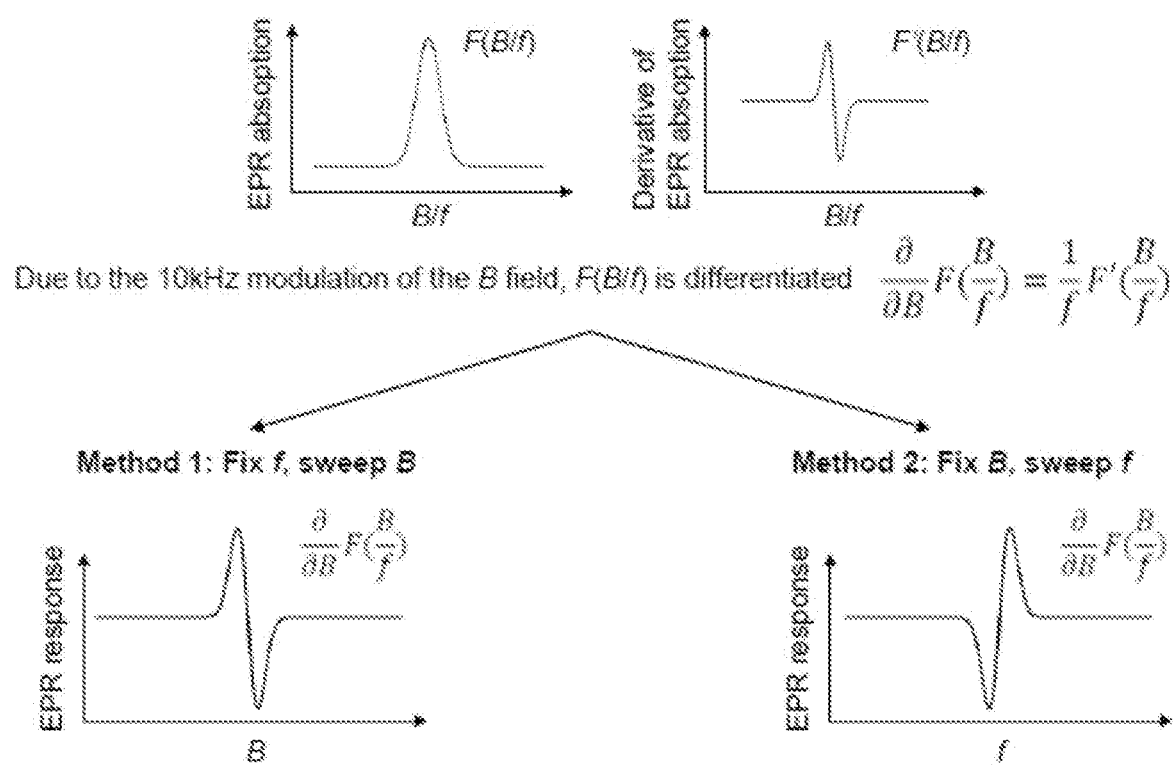
FIGS. 18(a)-18(c) show the principles of the magnetic field-sweep and the frequency-sweep methods in EPR spectroscopy.

The principles of the magnetic field-sweep and the frequency-sweep methods in EPR spectroscopy are shown in FIGS. 18(a)-18(c). The EPR response of a sample near magnetic field $B_0$ and frequency $f_0$ is a function of (B/f): F(B/f). Due to the 10 kHz modulation of the B field, F(B/f) is differentiated $$\frac{\partial}{\partial B} F\left(\frac{B}{f}\right) = \frac{1}{f} F'\left(\frac{B}{f}\right).$$

As shown in 18(b), method 1 may involve fixing f and sweeping B. As f is fixed, the line shape is the same as F (B/f). As shown in 18(c), method 2 may involve fixing B and sweeping f. As f is not fixed, the line shape is different with F (B/f). For samples with narrow line-width, the variation of f is small. Therefore, the measured line shape is in close proximity to F (B/f).

EPR Spectrometer Measurement Results

Figures 19A, 19B:
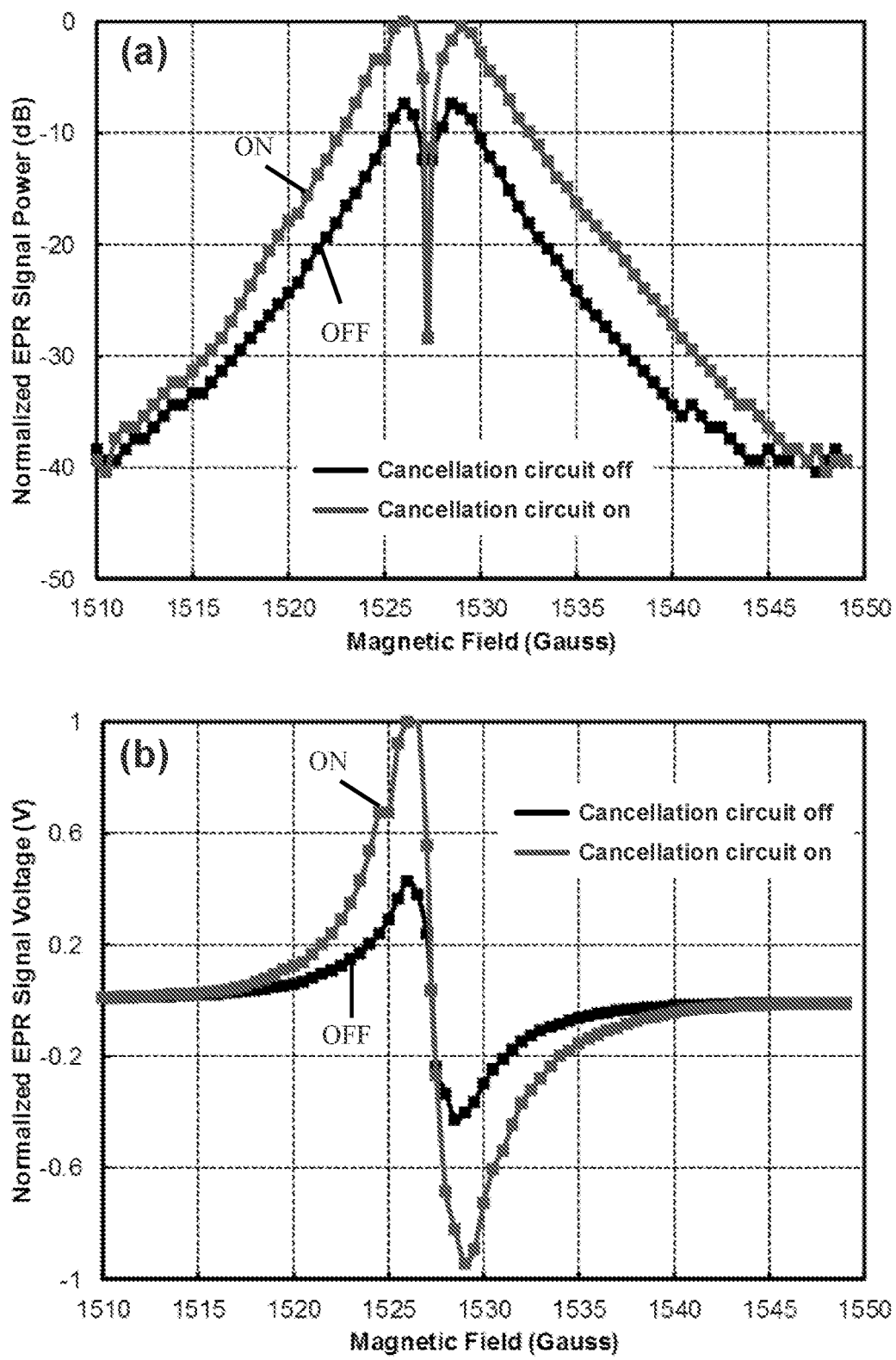
FIGS. 19(a)-19(b) show measured EPR response from DPPH powder sample in (a) log scale and (b) linear scale using the $B_0$-sweep method.

Utilizing the reported transceiver, an EPR spectrometer was built and tested. The resonator of the spectrometer has a quality factor of approximately 30. FIGS. 19(a)-19(b) respectively plot the measured EPR response of a DPPH sample the assembled spectrometer. During the measurement, the frequency of the TX signal is fixed, and the $B_0$ field is swept with a 100 kHz modulation. The TX delivers around 20 dBm output power, and the self-interference power at the input of the RX is approximately −10 dBm. As shown in FIG. 19(a), if the cancellation circuit is configured to cancel the TX self-interference, the resulted SNR increases by approximately 7 dB. This demonstrates the effectiveness of the self-interference cancellation circuit. Compared to a EPR spectrometer based on a single-chip transceiver without active cancellation, the sensitivity of the reported spectrometer is 25 dB higher.

Figures 20A, 20B:
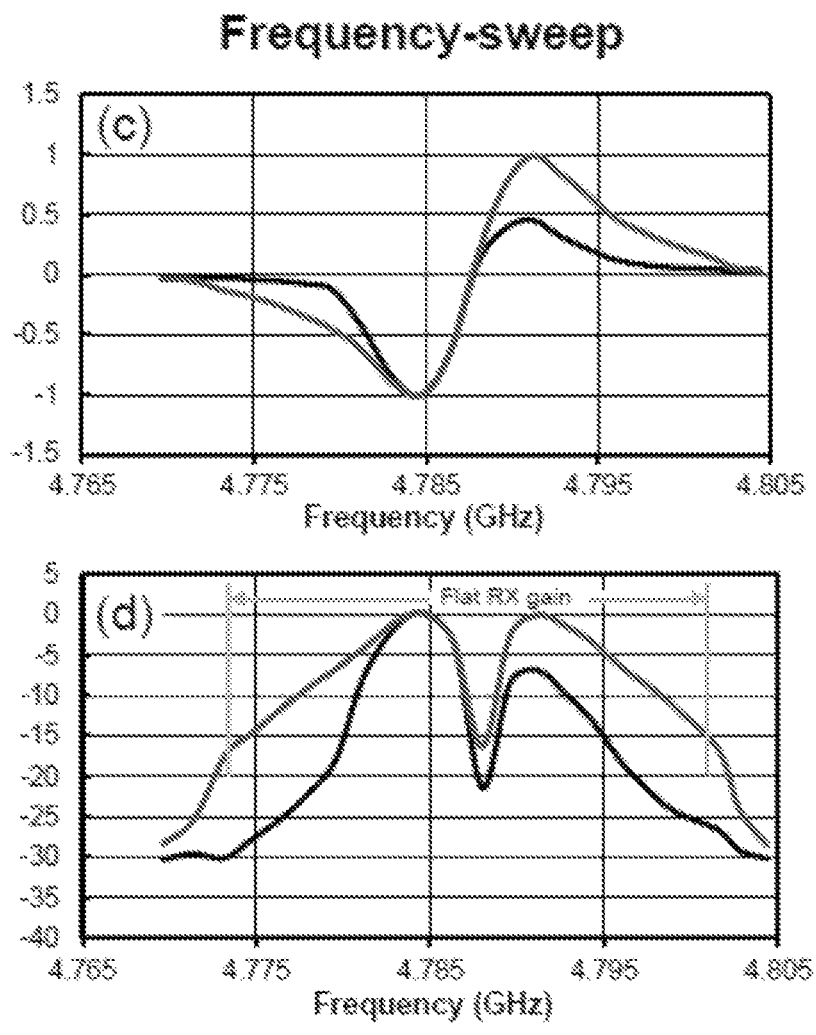
FIGS. 20(a)-20(b) measured EPR response for DPPH power using the frequency sweep method in (c) linear scale and (d) log scale.

In addition to the method of B0-sweep, for the first time, the method of frequency sweep is successfully performed in the EPR spectroscopy. The results of this measurement are shown in FIGS. 20(a) and 20(b). This measurement is very challenging in conventional EPR spectrometers because, as the frequency deviates from the resonance frequency of the resonator, the reflected TX power saturates the RX, alters the conversion gain, and distorts the EPR response. However, it is demonstrated that the active cancelation keeps the RX gain flat, even when the frequency deviates from the resonance frequency of the resonator by more than 10 MHz. This feature reduces the distortion by up to 15 dB, which is sufficient to capture the EPR response of samples with a narrow line-width, including DPPH.

Figures 21A, 21B:
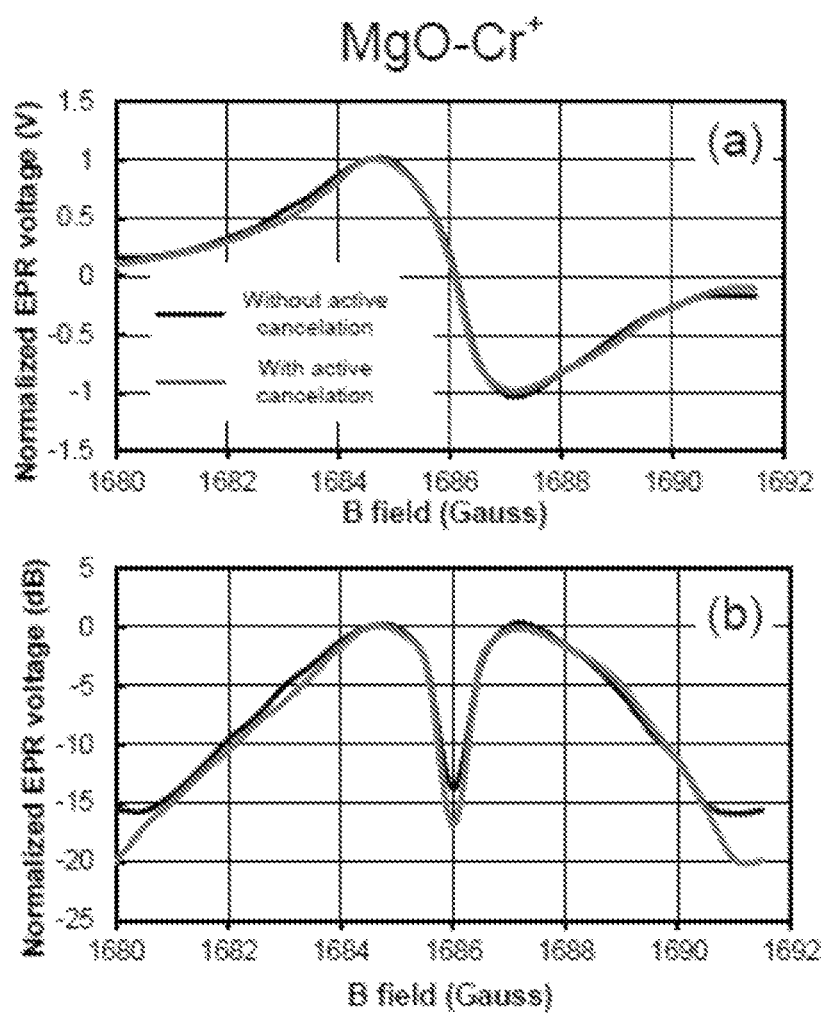
FIGS. 21(a)-21(b) respectively show the measured EPR response of MgO—$Cr^+$ crystal in the linear scale and log scale using the $B_0$-sweep method.
Figures 21C, 21D:
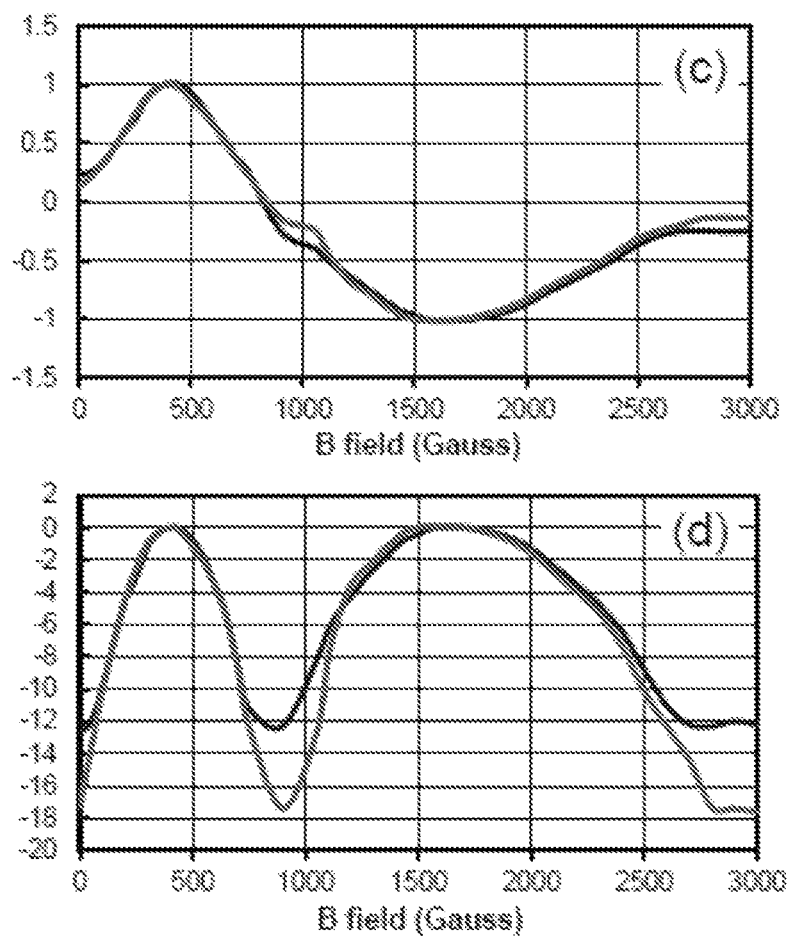
FIGS. 21(c)-21(d) respectively show the measured EPR response of 63 mg $Fe_3O_4$ nanoparticles in the linear scale and log scale using the $B_0$-sweep method.

FIGS. 21(a) and 21(b) are the measured EPR response of 52 mg MgO—$Cr^+$ crystal in the linear scale and log scale using the $B_0$-sweep method, respectively. FIGS. 21(c) and 21(d) are the measured EPR response of 63 mg $Fe_3O_4$ nanoparticles in the linear scale and log scale using the $B_0$-sweep method, respectively. The average particle size of the $Fe_3O_4$ nanoparticles is 20 nm.

The active cancellation system and EPR sensors discussed herein may have broad applicability to various applications involving identifying and locating certain types of materials. In some embodiments, the active cancellation system and EPR sensor can be utilize for a method of detecting EPR spectrum of transitional metals, asphaltenes, vanadium, Fe2+, Mn2+, organic materials in crude oil, Kerogen, naturally occurring free radicals, magnetic nano-particles, and scale. The EPR response of Kerogen in rock, rack samples, shale, etc. can be used for the purpose of characterization, type of and amount of Kerogen, including determining maturity of hydrocarbon within the rock. In this application, we can filter and sample rock (e.g. bit cuttings) at the surface during drilling operations, as a nonlimiting example during LWD (Logging While Drilling) & MWD (Measurement While Drilling) operations, in a dedicated tool measuring rock formation. This may occur during drilling at or close behind drill bit or in a laboratory setting.

EPR can be used to characterize asphaltenes in the flow of fluids retrieve from the well or in the rock formation. It can also be used to characterize asphaltenes in the sample rock (e.g. bit cuttings) at the surface during drilling operations; during LWD & MWD operations in dedicate tool measuring rock formation during drilling at or close behind drill bit; or in a laboratory setting.

EPR can be used, but not limited to, as a dedicated tool for LWD & MDW operations. These measurements can be done in dedicated wireline tool; after drilling as open hole reservoir characterization tool; or later in the life of the well as reservoir characterization and optimization tool. Non-limiting examples include asphaltene profiling through reservoir, kerogen profiling throughout formations, or the like. Applications include characterizing kerogen, asphaltene, or the like in tight shale source rock, conventional, or unconventional reservoirs.

EPR can also be used as a tracer monitoring to characterize or measure the concentration of magnetic or paramagnetic nano-particle materials in harsh high temperature high pressure well environments. A non-limiting example includes injecting nanoparticles with different EPR signatures in different injection wells. Then using an EPR sensor in a production well (e.g. well-head) to detect the concentration of the injected nanoparticles in the production well. Nonlimiting applications for such techniques include using such measurements to estimate the connectivity of different injection wells to a production well, well mapping including the mapping of the well pathway and fractures, or the like.

EPR can also be used in downstream industry to improve the efficiency and use of chemicals in manufacturing processes. Non-limiting examples include measuring asphaltenes concentration in oil refining processes, measuring oxygen properties in process of making beer, measuring the level of free-radicals in food processing, measuring the quality of engine oil in motors or vehicles, or the like.

EPR can also be used to measure the type and severity of corrosion by measuring the concentration of transition metals or metal ions such as $Fe2+$, $Mn2+$, or $Fe3O4$, or $Fe2O3$ in a flow (e.g. in pipelines).

Figure 22:
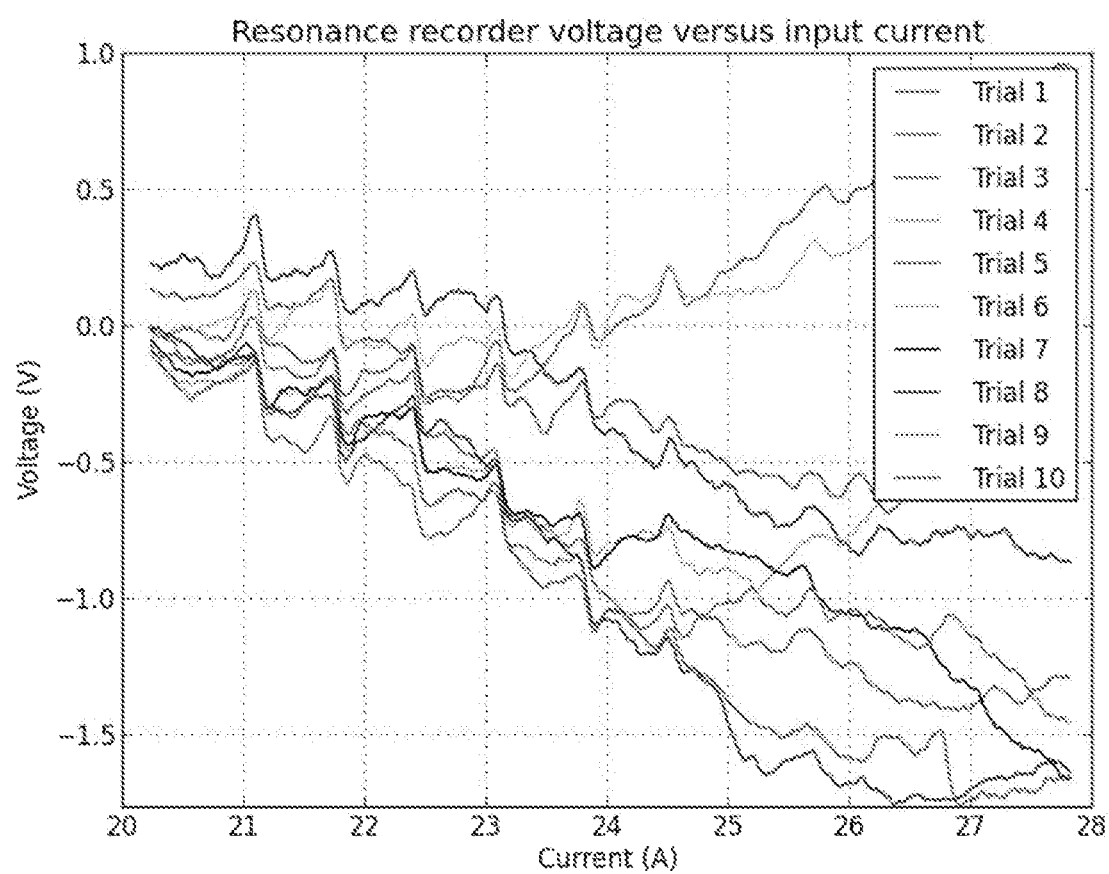
FIG. 22 shows EPR recorder voltage v. current for several trials.

As a nonlimiting example, the EPR spectrum can be used to monitor corrosion processes (e.g. $Fe2+$, $Mn2+$). The EPR spectrum can be used to monitor asphaltenes aggregation and concentration in flow-assurance. It can also be used to determine flow composition and flow rate by measuring the asphaltenes concentration and velocity. Magnetic nanoparticles can be used as tracers in exploration and EPR can detect them. For flow-assurance, it is possible to build a closed-loop system where EPR sensor detects a problem (such as asphaltenes aggregation/deposition) and chemical injection is used to mitigate the problem (the claim on closed-loop system). FIG. 22 shows EPR recorder voltage v. current for several trials.

Conclusion: The first fully-integrated transceiver with active TX leakage/noise cancelation is reported. The single chip transceiver is utilized to build a complete EPR spectrometer. The transceiver is capable of performing both B0-sweep and frequency-sweep EPR spectroscopy. In the B0-sweep, an SNR improvement of 15 dB compared to previous work is achieved. Furthermore, for the first time, the method of frequency-sweep is performed in EPR spectroscopy.

An in-band full-duplex transceiver for EPR spectroscopy application is reported. The transceiver utilizes a self-interference cancellation circuit to mitigate the TX self-interference problem. The TX was able to deliver 20 dBm power while maintaining a low NF of RX under a strong TX self-interference signal. The transceiver has the lowest NF and flicker noise corner, compared to prior in-band full-duplex transceivers. Using the reported transceiver, an EPR spectrometer is built and tested. Compared to previous EPR spectrometers based on single-chip transceivers, the reported EPR spectrometer improves the SNR by 25 dB.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. An active cancellation system comprising:
   an attenuator/amplitude tuner receiving an output signal of a transmitter, wherein the attenuator/amplitude tuner provides attenuation and amplitude tuning of the output signal to produce a signal for cancellation of a TX self-interference signal;
   a buffer receiving the signal from the attenuator/amplitude tuner, wherein the buffer provides additional amplitude tuning; and
   a phase shifter receiving a buffer output signal from the buffer, wherein the buffer output signal is phase shifted to 180° relative to the TX self-interference signal to form a cancellation signal that is outputted to a receiver, wherein the cancellation signal is injected after a low-noise amplifier (LNA) of the receiver to minimize a noise figure (NF) degradation of the receiver due to active cancellation circuitry.

2. The system of claim 1, where the buffer output signal is a differential signal, and the active cancellation system further comprises an I/Q generator receiving the differential signal from the buffer, wherein the I/Q generator converts the differential signal into a quadrature signal; and
   wherein further the phase shifter receives the quadrature signal from the I/Q generator, and the quadrature signal is phase shifted to produce the cancellation signal.

3. The system of claim 1, wherein the attenuator/amplitude tuner comprises a voltage divider or an active transistor-based circuit for attenuation.

4. The system of claim 3, wherein an amplitude tuner is merged with an attenuator, and the amplitude tuner comprises two varactors.

5. The system of claim 1, wherein the buffer comprises high breakdown transistors.

6. The system of claim 1, wherein a load impedance of the buffer can be varied to provide additional amplitude tuning.

7. The system of claim 2, wherein the phase shifter assigns different weights to I and Q signals.

8. The system of claim 7, wherein the phase shifter combines the I and Q signals to provide the cancellation signal.

9. The system of claim 1, wherein the transmitter and the receiver are components of a single-chip transceiver.

10. The system of claim 9, wherein the single-chip transceiver is part of an Electron Paramagnetic Resonance (EPR) spectrometer.

11. The system of claim 1, wherein the cancellation signal cancels power leakage or self-interference from the transmitter.

12. An active cancellation method comprising:
receiving an output signal of a transmitter;
attenuating the output signal and tuning an amplitude of the output signal to produce a signal for cancellation of a TX self-interference signal;
buffering the signal after attenuating and tuning steps to provide additional amplitude tuning to output a buffer output signal;
phase shifting the buffer output signal 180° relative to a TX self-interference signal to provide a cancellation signal; and
outputting the cancellation signal to a receiver based on the TX self-interference signal caused by the transmitter, wherein the cancellation signal is injected after a low-noise amplifier (LNA) of the receiver to minimize a noise figure (NF) degradation of the receiver due to active cancellation circuitry.

13. The method of claim 12, where the buffer output signal is a differential signal and the phase shifting step is implemented by receiving the differential signal and converting the differential signal into a quadrature signal;
phase shifting the quadrature signal;
combining branches of the quadrature signal to produce the cancellation signal.

14. The method of claim 12, wherein the attenuating and the tuning of the amplitude steps are performed with an attenuator/amplitude tuner that comprises a voltage divider.

15. The method of claim 14, wherein an amplitude tuner is merged with an attenuator, the amplitude tuner comprises two varactors.

16. The method of claim 12, wherein the buffering is performed with a buffer comprising high breakdown transistors.

17. The method of claim 12, wherein a load impedance of a buffer providing the buffering can be varied to provide additional amplitude tuning.

18. The method of claim 13, wherein the phase shifting step assigns different weights to I and Q signals.

19. The method of claim 18, wherein the phase shifting combines the I and Q signals to provide the cancellation signal.

20. The method of claim 12, wherein the transmitter and the receiver are components of a single-chip transceiver.

21. The method of claim 20, wherein the single-chip transceiver is part of an Electron Paramagnetic Resonance (EPR) spectrometer.

22. The method of claim 12, wherein the cancellation signal cancels power-leakage or self-interference from the transmitter.

* * * * *